(12) United States Patent
Abe

(10) Patent No.: US 10,086,605 B2
(45) Date of Patent: Oct. 2, 2018

(54) LIQUID EJECTING APPARATUS, DRIVE CIRCUIT, AND DRIVING METHOD

(71) Applicant: SEIKO EPSON CORPORATION, Tokyo (JP)

(72) Inventor: Akira Abe, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/675,891

(22) Filed: Aug. 14, 2017

(65) Prior Publication Data

US 2018/0086058 A1    Mar. 29, 2018

(30) Foreign Application Priority Data

Sep. 26, 2016  (JP) ................. 2016-187565

(51) Int. Cl.
*B41J 2/045*     (2006.01)
*H03K 4/94*      (2006.01)

(52) U.S. Cl.
CPC ......... *B41J 2/04581* (2013.01); *B41J 2/0455* (2013.01); *B41J 2/0457* (2013.01); *B41J 2/0459* (2013.01); *B41J 2/04541* (2013.01); *B41J 2/04573* (2013.01); *H03K 4/94* (2013.01)

(58) Field of Classification Search
CPC .... B41J 2/04581; B41J 2/0457; B41J 2/0459; B41J 2/04573; B41J 2/0455; B41J 2/04541; H03K 4/94
See application file for complete search history.

(56) References Cited

U.S. PATENT DOCUMENTS

| 7,852,128 | B2 | 12/2010 | Kitazawa et al. | |
| 8,757,749 | B2* | 6/2014 | Oshima | B41J 2/04541 347/10 |
| 9,174,435 | B2* | 11/2015 | Yoshino | B41J 2/04541 |
| 9,862,185 | B2* | 1/2018 | Shima | B41J 2/04586 |
| 2017/0266961 | A1* | 9/2017 | Tamura | B41J 2/04586 |

FOREIGN PATENT DOCUMENTS

JP   2009-190287 A   8/2009
JP   2010-114711 A   5/2010

\* cited by examiner

*Primary Examiner* — Julian Huffman
*Assistant Examiner* — Michael Konczal

(57) ABSTRACT

A drive circuit which drives a capacitive load on the basis of a drive signal output from a node includes a first wire; a second wire; an amplification unit; a capacitor and a resistance element; a determination unit which determines whether or not a voltage of a differentiated drive signal is within a predetermined range in case where a magnitude of a voltage change of the signal is less than or equal to a threshold; and a voltage output unit which amplifies the a voltage of the signal by a predetermined multiple, for example, one time, and outputs the amplified signal toward the node in a case where it is determined that the voltage of the differentiated drive signal is within the predetermined range.

10 Claims, 22 Drawing Sheets

⟨DECODED CONTENT OF DECODER⟩

| PRINT DATA SI | T1 | | T2 | |
|---|---|---|---|---|
| | Sa | Sb | Sa | Sb |
| LARGE DOT ----▶ (1, 1) | H | L | H | L |
| MEDIUM DOT ----▶ (0, 1) | H | L | L | H |
| SMALL DOT ----▶ (1, 0) | L | L | L | H |
| NO RECORD ----▶ (0, 0) | L | H | L | L |

MSB  LSB

LIQUID EJECTING APPARATUS, DRIVE CIRCUIT, AND DRIVING METHOD

BACKGROUND

1. Technical Field

The present invention relates to a liquid ejecting apparatus, a drive circuit, and a driving method.

2. Related Art

An apparatus which uses a piezoelectric element (for example, a piezo element) is known as an ink jet printer which prints an image or a document by ejecting ink. Piezoelectric elements are provided in correspondence with each of multiple nozzles in a head unit and each of the piezoelectric elements is driven in accordance with a drive signal. A predetermined amount of ink (liquid) is ejected by such driving from the nozzle at a predetermined timing, and thereby, dots are formed. The piezoelectric element is a capacitive element such as a capacitor from a viewpoint of electricity, and needs to receive a sufficient current in order to operate the piezoelectric elements of each nozzle.

Accordingly, an ink jet printer has a configuration in which an original drive signal that is an origin of a drive signal is amplified by an amplification circuit, is supplied to a head unit as the drive signal, and drives a piezoelectric element. For example, D-class amplification is proposed as the amplification circuit (refer to JP-A-2010-114711). In short, in the D-class amplification, a pulse modulation of the original drive signal is performed, a high side transistor and a low side transistor serially inserted between the power supply voltages are switched in accordance with a modulation signal, an output signal generated by the switching is filtered by a low-pass filter, and thereby, the original drive signal is amplified.

However, a problem is pointed out in which a circuit configuration increases in size and waveform reproducibility of a drive signal with respect to an original drive signal is bad in the D-class amplification. In detail, in the D-class amplification, even in a case where, for example, an output voltage has to be kept constant, a high side transistor and a low side transistor are alternately switched, and thereby, a ripple caused by the switching easily ride. If it is intended to remove the ripple by using the low pass filter, a problem occurs in which a large capacitor and an inductor with a large L value are required as configuration elements of the low pass filter and thereby a device configuration is bulky and furthermore waveform reproducibility decreases due to a dull waveform.

SUMMARY

An advantage of some aspects of the invention is to provide a liquid ejecting apparatus, a drive circuit, and a driving method which have good waveform reproducibility.

According to an aspect of the invention, there is provided a liquid ejecting apparatus including an ejecting unit that includes a piezoelectric element which is driven based on a drive signal that is output from a predetermined output terminal, and ejects liquid by driving the piezoelectric element; an amplification unit that amplifies an original drive signal which is an origin of the drive signal and outputs the amplified signal toward the output terminal; a first wire that transmits the drive signal from the output terminal toward the piezoelectric element; a second wire that feeds back the drive signal which is transmitted by the first wire; a differentiation circuit that differentiates the drive signal which is fed back by the second wire; a determination unit that determines whether or not a voltage of the drive signal which is differentiated by the differentiation circuit is within a predetermined range, in a case where a magnitude of a voltage change of the original drive signal is less than or equal to a predetermined threshold; and a voltage output unit that outputs a voltage according to the original drive signal toward the output terminal, in a case where it is determined that the voltage of the drive signal which is differentiated by the differentiation circuit is within the predetermined range.

According to the liquid ejecting apparatus of the aspect, a low pass filter is not necessary in D-class amplification, and thus, it is possible to prevent a device configuration from increasing in size. In addition, in a case where the voltage change of an original drive signal is small, a voltage output unit outputs a voltage according to the original drive signal toward the output terminal when a es a voltage range from a voltage maximum value to a voltage predetermined range, that is, when a current of a drive signal which is an output is small, and thus, ripples are hard to ride, spike noise or the like is also hard to occur, and an error of the drive signal with respect to the original drive signal can also be reduced.

In the liquid ejecting apparatus according to the aspect, a configuration including a third wire and a fourth wire which are adjacent to the second wire and to which a predetermined voltage is applied may be provided.

In the liquid ejecting apparatus according to the aspect, a first substrate in which the amplification unit, the determination unit, and the voltage output unit are mounted, and a second substrate that is coupled to the first substrate through the first wire and the second wire may be included.

In addition, in the liquid ejecting apparatus according to the aspect, the amplification unit may include a differential amplifier that outputs a control signal on the basis of a signal based on the original drive signal and the drive signal, a high side transistor that is coupled between a high side of a power supply and the output terminal, a low side transistor that is coupled between the output terminal and a low side of the power supply, and a select unit that selects the high side transistor or the low side transistor depending on the voltage change of the original drive signal, and supplies the control signal toward a gate terminal of the selected transistor.

Coupling means direct and indirect coupling between two elements or more and includes existence of one intermediate element or more between the two elements or more. In the above examples, a diode for preventing a reverse current may be provided between the high side transistor and the output terminal.

In a configuration including the high side transistor, the low side transistor, and the select unit, the select unit may supply the control signal toward a gate terminal of the high side transistor in a first case where the voltage change of the original drive signal is in an increasing direction and the magnitude of the voltage change exceeds the threshold, and may supply the control signal toward a gate terminal of the low side transistor in a second case where the voltage change of the original drive signal is in a decreasing direction and the magnitude of the voltage change exceeds the threshold.

Furthermore, in a case where the magnitude of the voltage change of the original drive signal is less than or equal to the threshold, the select unit may supply a signal that turns off the high side transistor toward the gate terminal of the high side transistor and may supply a signal that turns off the low side transistor toward the gate terminal of the low side transistor, and in the first case, the select unit may supply a signal that turns off the low side transistor toward the gate terminal of the low side transistor, and in the second case, the select unit may supply a signal that turns off the high side transistor toward the gate terminal of the high side transistor.

In the liquid ejecting apparatus according to the aspect, the voltage output unit may include a linear amplifier that amplifies a voltage of the original drive signal by a predetermined multiple, and a switch that is provided between the linear amplifier and the output terminal and is turned on in a case where it is determined that a voltage of a drive signal which is differentiated by the differentiation circuit is within a predetermined range.

In addition, in the liquid ejecting apparatus according to the aspect, the ejecting unit, the amplification unit, the determination unit, and the voltage output unit may be configured to be mounted on a movable carriage.

The liquid ejecting apparatus may eject liquid, and includes a three-dimensional shaping apparatus (so-called 3D printer), a textile printing apparatus, or the like, in addition to a printing apparatus which will be described below.

In addition, the invention is not limited to a liquid ejecting apparatus, can be realized in various aspects, and can also be conceptualized by a drive circuit which drives a capacitive load such as a piezoelectric element, a driving method, furthermore a head unit in the liquid ejecting apparatus, or the like.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the drawings by using a printing apparatus as an example.

Since there are several aspects in the printing apparatus 1 according to the embodiments, there is a case where parentheses including words are given instead of symbols, such as a printing apparatus (first apparatus) or a printing apparatus (second apparatus) so as to distinguish from each other.

Figure 1:
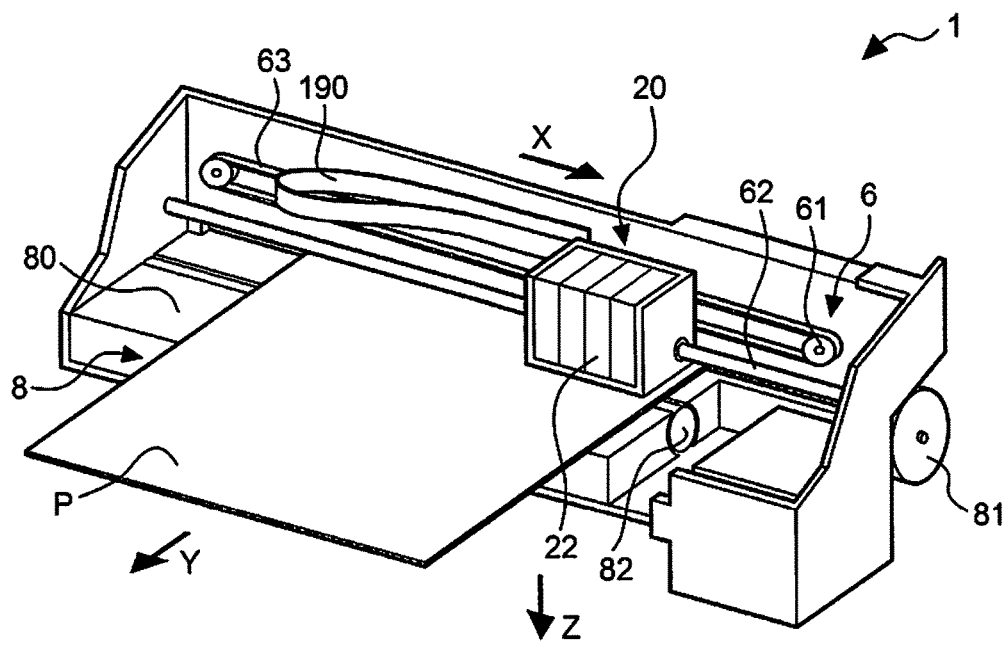
FIG. 1 is a view illustrating a schematic configuration of a printing apparatus (first apparatus).

FIG. 1 is a perspective view illustrating a schematic configuration of a printing apparatus (first apparatus).

The printing apparatus 1 (first apparatus) illustrated in FIG. 1 is a type of a liquid ejecting apparatus which ejects ink that is an example of liquid to form an ink dot group on a medium P such as paper, thereby, printing an image (including characters, graphics, or the like).

As illustrated in FIG. 1, the printing apparatus (first apparatus) includes a moving mechanism 6 which moves (moves back and forth) a carriage 20 in a main scanning direction (X direction).

The moving mechanism 6 includes a carriage motor 61 which moves the carriage 20, a carriage guide axis 62 both of which are fixed, and a timing belt 63 which extends substantially parallel to the carriage guide axis 62 and is driven by the carriage motor 61.

The carriage 20 is supported by the carriage guide axis 62 so as to move freely back and forth, and is fixed to a part of the timing belt 63. Accordingly, if the timing belt 63 travels forward and backward by the carriage motor 61, the carriage 20 is guided by the carriage guide axis 62 and moves back and forth.

A printing head 22 is mounted in the carriage 20. The printing head 22 includes multiple nozzles which respectively eject ink in the Z direction onto a portion which faces the medium P. The printing head 22 is divided into approximately four blocks for color printing. The four blocks respectively eject black (Bk) ink, cyan (C) ink, magenta (M) ink, and yellow (Y).

There is provided a configuration in which various control signals or the like from a main substrate (omitted in FIG. 1) through a flexible flat cable 190, are supplied to the carriage 20.

The printing apparatus (first apparatus) includes a transport mechanism 8 which transports the medium P on a platen 80. The transport mechanism 8 includes a transport motor 81 which is a drive source, and a transport roller 82 which is rotated by the transport motor 81 and transports the medium P in a sub-scanning direction (Y direction).

In the configuration, an image is formed on a surface of the medium P by ejecting ink in accordance with print data from the nozzles of the printing head 22 in accordance with main scanning of the carriage 20, and repeating an operation of transporting the medium P in accordance with the transport mechanism 8.

In the present embodiment, the main scanning is performed by moving the carriage 20, but may be performed by moving the medium P, and may be performed by moving both the carriage 20 and the medium P. The point is that there may be provided a configuration in which the medium P and the carriage 20 (printing head 22) move relatively.

Figure 2:
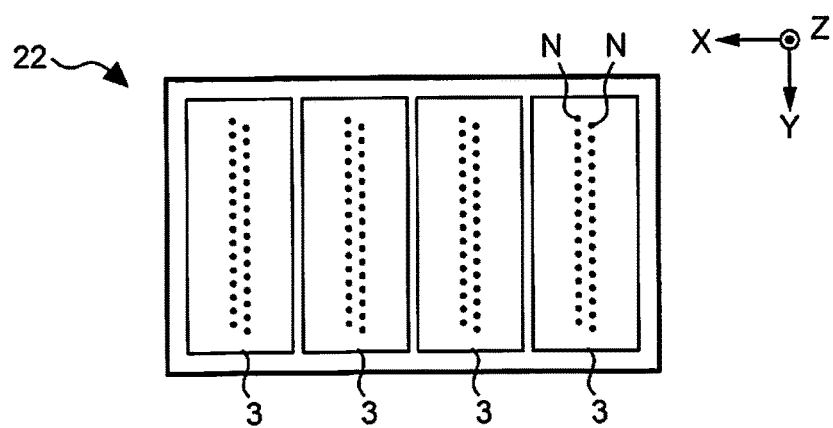
FIG. 2 is a diagram illustrating arrangement of nozzles in a head unit of the printing apparatus (first apparatus).

FIG. 2 is a diagram illustrating a configuration in a case in which an ejecting surface of ink in the printing head 22 is viewed from the medium P. As illustrated in FIG. 2, the printing head 22 includes four head units 3. The four head units 3 are arranged in the X direction which is a main scanning direction in correspondence with black (Bk), cyan (C), magenta (M), and yellow (Y), respectively.

Figure 3:
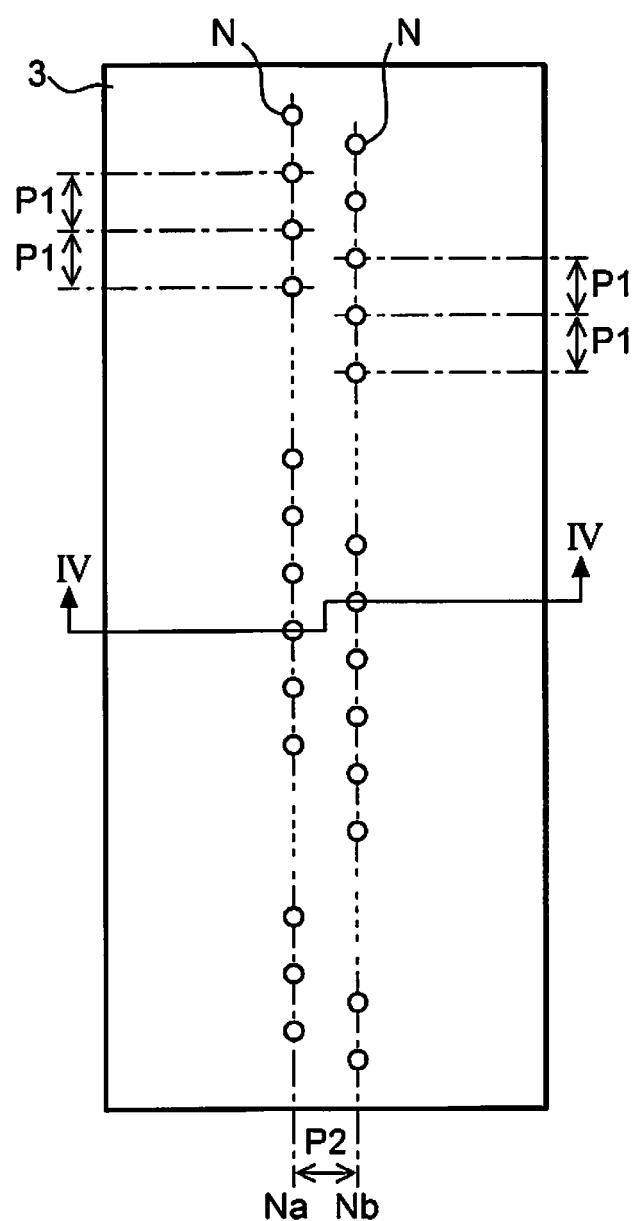
FIG. 3 is an enlarged diagram illustrating arrangement of the nozzles.

FIG. 3 is a diagram illustrating arrangement of nozzles in one head unit 3.

As illustrated in FIG. 3, multiple nozzles N are arranged in two columns in one head unit 3. For the sake of convenience, the two columns are respectively referred to as a nozzle column Na and a nozzle column Nb.

Multiple nozzles N are respectively arranged in the Y direction which is a subscan direction by a pitch P1 in the nozzle columns Na and Nb. In addition, the nozzle columns Na and Nb are separated from each other by a pitch P2 in the X direction. The nozzles N in the nozzle column Na are shifted from the nozzles N in the nozzle column Nb by half of the pitch P1 in the Y direction.

In this way, the nozzles N are arranged so as to be shifted by half of the pitch P1 in the two columns of the nozzle columns Na and Nb in the Y direction, and thereby it is possible to increase resolution in the Y direction substantially twice as much as a case of one column.

The number of nozzles N in one head unit 3 is referred to as m (m is an integer greater than or equal to 2) for the sake of convenience.

As will be described below, the head unit 3 has a configuration in which a COF is coupled to an actuator substrate including m nozzles N and piezoelectric elements provided in correspondence with the m nozzles N. Hence, for the sake of convenience of description, a structure of the actuator substrate will be described.

Figure 4:
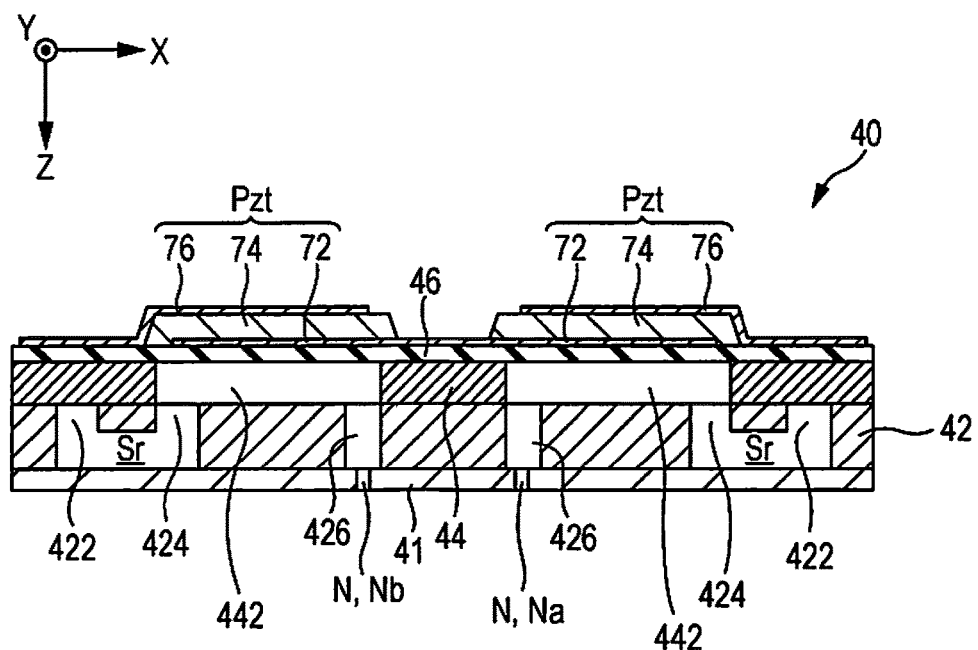
FIG. 4 is a sectional view illustrating an essential configuration of the head unit.

FIG. 4 is a sectional view illustrating a structure of the actuator substrate. In detail, FIG. 4 is a view illustrating a cross section taken along line IV-IV of FIG. 3.

As illustrated in FIG. 4, the actuator substrate 40 has a structure in which a pressure chamber substrate 44 and a vibration plate 46 are provided on a surface on a negative side in the Z direction and a nozzle plate 41 is provided on a surface on a positive side in the Z direction, in a flow path substrate 42.

Schematically, each element of the actuator substrate 40 is a member of an approximately flat plate which is long in the Y direction, and is fixed to each other by for example, an adhesive or the like. In addition, the flow path substrate 42 and the pressure chamber substrate 44 are formed by, for example, a single crystal substrate of silicon.

The nozzles N are formed in the nozzle plate 41. A structure corresponding to the nozzles in the nozzle column Na is shifted from a structure corresponding to the nozzles in the nozzle column Nb by half of the pitch P1 in the Y direction, but the nozzles are formed approximately symmetrically except for that, and thus, the structure of the actuator substrate 40 will be hereinafter described by focusing on the nozzle column Na.

The flow path substrate 42 is a flat member which forms a flow path of ink, and includes an opening 422, a supply flow path 424, and a communication flow path 426. The supply flow path 424 and the communication flow path 426 are formed in each nozzle, and the opening 422 is continuously formed over the multiple nozzles and has a structure in which ink with a corresponding color is supplied. The opening 422 functions as a liquid reservoir chamber Sr, and a bottom surface of the liquid reservoir chamber Sr is configured by, for example, the nozzle plate 41. In detail, the nozzle plate 41 is fixed to the bottom surface of the flow path substrate 42 so as to close the opening 422, the supply flow path 424, and the communication flow path 426 which are in the flow path substrate 42.

The vibration plate 46 is installed on a surface on a side opposite to the flow path substrate 42, in the pressure chamber substrate 44. The vibration plate 46 is a member of an elastically vibratile flat plate, and is configured by stacking an elastic film formed of an elastic material such as a silicon oxide, and an insulating film formed of an insulating material such as a zirconium oxide. The vibration plate 46 and the flow path substrate 42 face each other with an interval in the inner side of each opening 422 of the pressure chamber substrate 44. A space between the flow path substrate 42 and the vibration plate 46 in the inner side of each opening 422 functions as a cavity 442 which provides pressure to ink. Each cavity 442 communicates with the nozzle N through the communication flow path 426 of the flow path substrate 42.

A piezoelectric element Pzt is formed in each nozzle N (cavity 442) on a surface on a side opposite to the pressure chamber substrate 44 in the vibration plate 46.

The piezoelectric element Pzt includes a common drive electrode 72 formed over the plurality of piezoelectric elements Pzt formed on a surface of the vibration plate 46, a piezoelectric body 74 formed on a surface of the drive electrode 72, and individual drive electrodes 76 formed in each piezoelectric element Pzt on a surface of the piezoelectric body 74. In the configuration, a region in which the piezoelectric body 74 is interposed between the drive electrode 72 and the drive electrode 76 which face each other, functions as the piezoelectric element Pzt.

The piezoelectric body 74 is formed in a process which includes, for example, a heating process (baking). In detail, the piezoelectric body 74 is formed by baking a piezoelectric material which is applied to a surface of the vibration plate 46 on which multiple drive electrodes 72 are formed, using heating processing of a furnace, and then molding (milling by using, for example, plasma) the baked material for each piezoelectric element Pzt.

In the same manner, the piezoelectric element Pzt corresponding to the nozzle column Nb is also configured to include the drive electrode 72, the piezoelectric body 74, and the drive electrode 76.

In addition, in this example, in the piezoelectric body 74, the common drive electrode 72 is used as a lower layer and the individual drive electrodes 76 are used as an upper layer, but in contrast to this, a configuration in which the common drive electrode 72 is used as an upper layer and the individual drive electrodes 76 are used as a lower layer, may be provided.

Meanwhile a voltage Vout of a drive signal according to the amount of ink to be ejected is individually applied from a circuit substrate to the drive electrode 76 which is a terminal of the piezoelectric element Pzt, a holding signal of a voltage $V_{BS}$ is commonly applied to the drive electrode 72 which is the other terminal of the piezoelectric element Pzt.

Accordingly, the piezoelectric element Pzt becomes displaced upwardly or downwardly in accordance with a voltage which is applied to the drive electrodes 72 and 76. In detail, if the voltage Vout of the drive signal which is applied through the drive electrode 76 decreases, the central portion of the piezoelectric element Pzt is bent upwardly in the figure with respect to both end portions, and meanwhile, if the voltage Vout increases, the central portion of the piezoelectric element Pzt is bent downwardly.

If the central portion is bent upwardly, an internal volume of the cavity 442 increases (pressure decreases), and thus ink is drawn from the liquid reservoir chamber Sr. Meanwhile, if the central portion is bent downwardly, an internal volume of the cavity 442 decreases (pressure increases), and thus, an ink droplet is ejected from the nozzle N in accordance with the decreased degree. In this way, if a proper drive signal is applied to the piezoelectric element Pzt, ink is ejected from the nozzle N in accordance with the displacement of the piezoelectric element Pzt. Accordingly, an ejecting unit, which ejects ink in accordance with at least the piezoelectric element Pzt, the cavity 442, and the nozzle N, is configured.

Next, an electrical configuration of the printing apparatus (first apparatus) will be described.

Figure 5:
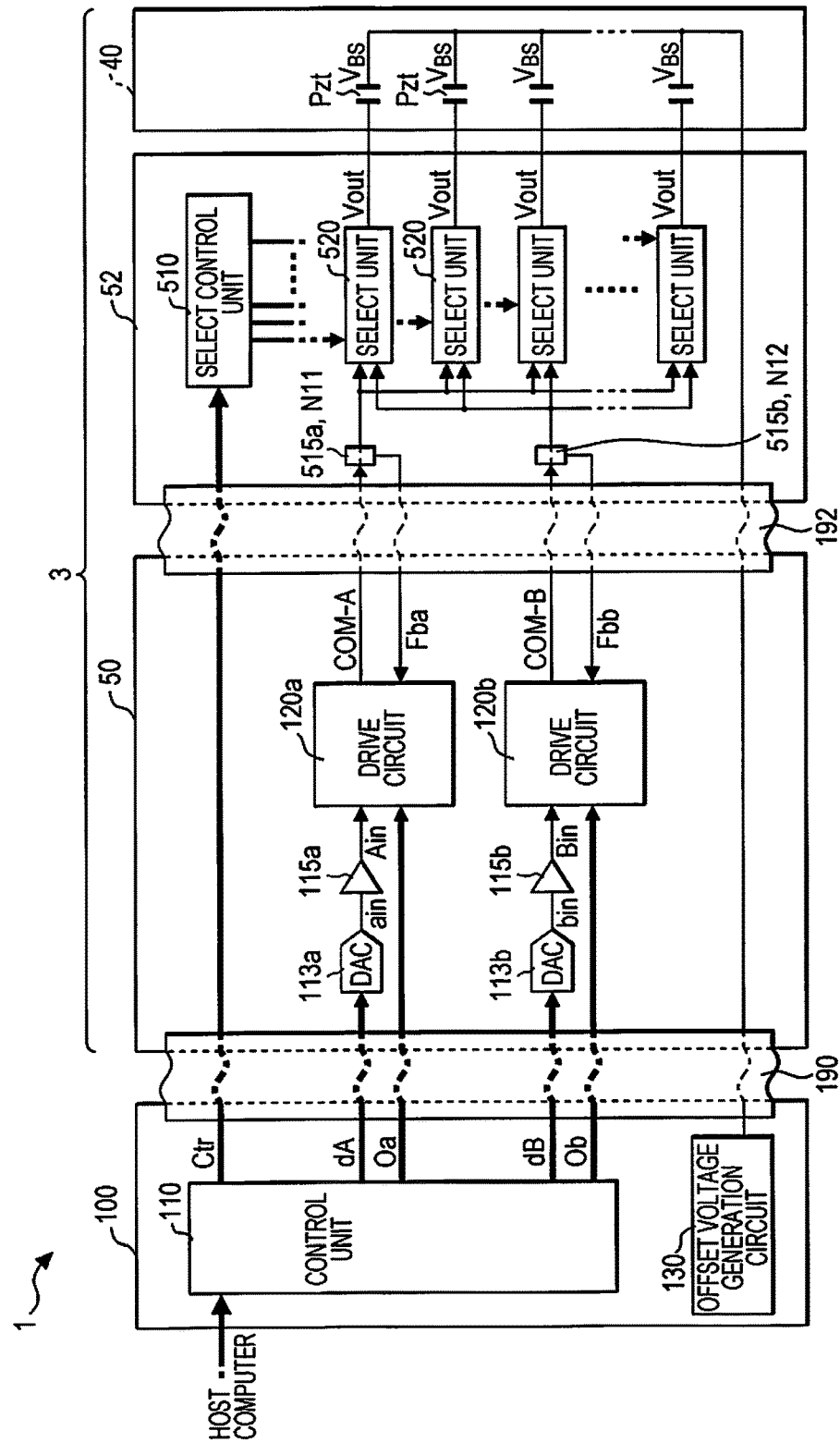
FIG. 5 is a block diagram illustrating an electrical configuration of the printing apparatus (first apparatus).

FIG. 5 is a block diagram illustrating an electrical configuration of the printing apparatus (first apparatus).

As illustrated in FIG. 5, the printing apparatus (first apparatus) has a configuration in which the head unit 3 is coupled to a main substrate 100 through a flexible flat cable 190.

The printing apparatus 1 includes four head units 3 and the main substrate 100 independently controls the four head units 3. The four head units 3 are the same as each other except that the colors of ink to be ejected are different from each other, and thus, hereinafter, one head unit 3 will be representatively described for the sake of convenience.

As illustrated in FIG. 5, the main substrate 100 includes a control unit 110 and a voltage generation circuit 130.

Among these, the control unit 110 is a type of a microcontroller having a CPU, a RAM, a ROM, and the like which are not illustrated in particular, and outputs each of various signals and the like for controlling each unit by executing a predetermined program, when image data which becomes a printing target is supplied from a host computer or the like.

Specifically, firstly, the control unit 110 supplies each of data dA and dB and signal groups Oa and Ob to the head unit 3 through the flexible flat cable 190. Here, the data dA is digital data defining a waveform of a drive signal COM-A. A signal group Oa is a group of signals which go to a logic level according to a voltage change of a signal defined by the data dA, and includes signals OEa, OCa, FLia, and the like.

The data dB is digital data defining a waveform of a drive signal COM-B. A signal group Ob is a group of signals which go to a logic level according to a voltage change of a signal defined by the data dB, and includes signals OEb, OCb, FLib, and the like.

The signal group Oa (signals OEa, OCa, and FLia) and the signal group Ob (signals OEb, OCb, and FLib) will be described below.

Secondly, the control unit 110 supplies various control signals Ctr to the head unit 3 through the flexible flat cable 190 in synchronization with control for the moving mechanism 6 and the transport mechanism 8. The control signal Ctr includes print data SI (ejection control signal) defining the amount of ink which is ejected from the nozzle N, a clock signal Sck used for transferring the print data, and signals LAT and CH defining a print cycle and the like.

The control unit 110 controls the moving mechanism 6 and the transport mechanism 8, but since the configurations are known, description thereon will be omitted.

In addition, the voltage generation circuit 130 generates a holding signal of a voltage $V_{BS}$ for holding the other terminals of the plurality of piezoelectric elements Pzt in a common state.

The head unit 3 is roughly divided into the actuator substrate 40, a circuit substrate 50, and a Chip On Film (COF) 52.

Among these, the circuit substrate 50 (first substrate) includes digital to analog converters (DACs) 113a and 113b, voltage amplifiers 115a and 115b, and drive circuits 120a and 120b.

The COF 52 (second substrate) is, for example, a film substrate on which conversion units 515a and 515b and a semiconductor integrated circuit are mounted, among which the semiconductor integrated circuit has a function of a select control unit 510 and a function of a select unit 520 corresponding one-to-one to the piezoelectric element Pzt. The COF 52 is coupled to the circuit substrate 50 through a flexible flat cable 192, and each output terminal of a plurality of select units 520 is coupled to the actuator substrate 40 (individual drive electrode 76 of the piezoelectric element Pzt).

The flexible flat cable 192 is covered with an insulating material in a state where a plurality of wires are arranged in approximately parallel thereon and a part or all of the plurality of wires are used for coupling the circuit substrate 50 to the COF 52.

The COF 52 is indirectly coupled to the circuit substrate 50 through the flexible flat cable 192 in the present embodiment, but the COF 52 may be configured to be directly coupled to the circuit substrate 50 without the flexible flat cable 192.

In addition, the holding signal of the voltage $V_{Bs}$ generated by the voltage generation circuit 130 in the main substrate 100 is commonly applied to the other terminals of the plurality of piezoelectric elements Pzt in the actuator substrate 40 through the flexible flat cable 190, the circuit substrate 50, the flexible flat cable 192, and the COF 52 in order.

Thus, the DAC 113a in the circuit substrate 50 converts the digital data dA into the analog signal ain. The voltage amplifier 115a amplifies a voltage of the signal ain by, for example, 10 times, and supplies the amplified voltage to the drive circuit 120a as a signal Ain. In the same manner, the DAC 113b converts the digital data dB into an analog signal bin, the voltage amplifier 115b amplifies a voltage of the signal bin by, for example, 10 times, and supplies the amplified voltage to the drive circuit 120b as a signal Bin.

As will be described in detail below, the drive circuit 120a increases (converts into low impedance) drive capability of the signal Ain based on the signal group Oa, and outputs the signal as the drive signal COM-A. The drive signal COM-A output from the drive circuit 120a is supplied to the plurality of select units 520 through the flexible flat cable 192 and a node N11 of the COF 52.

In addition, the drive circuit 120b increases drive capability of the signal Bin based on the signal group Ob, and outputs the signal as the drive signal COM-B. The drive signal COM-B output from the drive circuit 120b is supplied to the plurality of select units 520 through the flexible flat cable 192 and a node N12 of the COF 52.

The signals ain and bin which are previously converted, the signals Ain and Bin which are not impedance-converted, and the drive signals COM-A and COM-B have trapezoidal waveforms as will be described below.

The conversion unit 515a of the COF 52 converts a current of the drive signal COM-A flowing through the node N11 into a voltage. A signal Fba having the converted voltage is fed back to the drive circuit 120a through the flexible flat cable 192.

In the same manner, the conversion unit 515b converts a current of the drive signal COM-B flowing through the node N12 into a voltage. A signal having the converted voltage Fbb is fed back to the drive circuit 120b through the flexible flat cable 192.

When the current of the drive signal COM-A (COM-B) is zero, the conversion unit 515a (515b) outputs a voltage Vcm which will be described below. In the present embodiment, since a load of the drive circuit 120a (120b) is the capacitive piezoelectric element Pzt, in a case where the voltage of the drive signal COM-A (COM-B) having trapezoidal waveform is constant, the current of the drive signal COM-A (COM-B) is zero.

Meanwhile, in a case where the voltage of the drive signal COM-A (COM-B) having a trapezoidal waveform increases, a current flows from the drive circuit 120a (120b) toward the capacitive element Pzt. In this case, the conversion unit 515a increases a voltage of the signal Fba (Fbb) more than the voltage Vcm as the current increases.

In contrast to this, in a case where the voltage of the drive signal COM-A (COM-B) decreases, a current flows from the capacitive element Pzt toward the drive circuit 120a (120b). In this case, the conversion unit 515a decreases the voltage of the signal Fba (Fbb) more than the voltage Vcm as the current increases.

A configuration is proposed in which, for example, a resistance element is inserted into the node N11 (N12) which is a supply path of the drive signal COM-A (COM-B), and a voltage between both terminals of the resistance element is amplified and is output, as an example of the conversion unit 515a (515b). However, since heat generation of the resistance element in this configuration tends to be problematic, a configuration may be used in which a magnetic field generated by a current flowing through the supply path is converted into a voltage by a Hall element, and the voltage is amplified by an amplifier and is output.

In addition, the select control unit 510 in the COF 52 controls selection of each of the select units 520. In detail, the select control unit 510 temporarily stores print data, which is supplied in synchronization with a clock signal from the control unit 110, corresponding to several nozzles (piezoelectric elements Pzt) of the head unit 3, and instructs each select unit 520 to select the drive signals COM-A and COM-B in accordance with the print data at a start timing of a print cycle defined by a timing signal.

Each select unit 520 selects (or does not select any one) one of the drive signals COM-A and COM-B in accordance with the instruction of the select control unit 510, and applies the selected signal to one terminal of the corresponding piezoelectric element Pzt as a drive signal of the voltage Vout.

Since the signal ain (bin) is converted by the DAC 113a (113 b) of a semiconductor integrated circuit with a low breakdown voltage, the signal ain (bin) swings at a relatively small amplitude of, for example, approximately 0 to 4 V. In contrast to this, the drive signal COM-A (COM-B), which is a combination source of the drive signals applied to the piezoelectric elements Pzt, requires a relatively large amplitude of a voltage of approximately 0 to 40 V for sufficiently driving the piezoelectric elements Pzt.

Accordingly, the voltage amplifier 115a (115b) amplifies the voltage of the signal ain (bin) converted by the DAC 113a (113b), the drive circuit 120a (120b) performs impedance conversion of the signal Ain (Bin) whose voltage is amplified to output as the drive signal COM-A (COM-B), and the select unit 520 corresponding to one piezoelectric element Pzt selects (or does not select) the drive signal COM-A or COM-B in accordance with the amount of ink to be ejected to apply to one terminal of the piezoelectric element Pzt.

Meanwhile, the actuator substrate 40 in the head unit 3 includes the piezoelectric elements Pzt, each being provided for each nozzle N as described with reference to FIG. 4. The other terminal of each of the piezoelectric elements Pzt is commonly coupled to each other, and the voltages Vas is applied to the other terminals by the voltage generation circuit 130.

In the present embodiment, ink is ejected from one nozzle N maximum twice by one dot, and thus four gradations of a large dot, a medium dot, a small dot, and no record are represented. In the present embodiment, in order to represent the four gradations, two types of the drive signals COM-A and COM-B are prepared, and each cycle has first half pattern and a second half pattern. Then, during one cycle, the drive signals COM-A and COM-B are selected (or not selected) in accordance with a gradation to be represented in the first half and a second half, and the selected signal is supplied to the piezoelectric element Pzt.

Thus, the drive signals COM-A and COM-B will be first described, and thereafter, a detailed configuration of the select control unit 510 for selecting the drive signals COM-A and COM-B, and the select unit 520 will be described.

Figure 6:
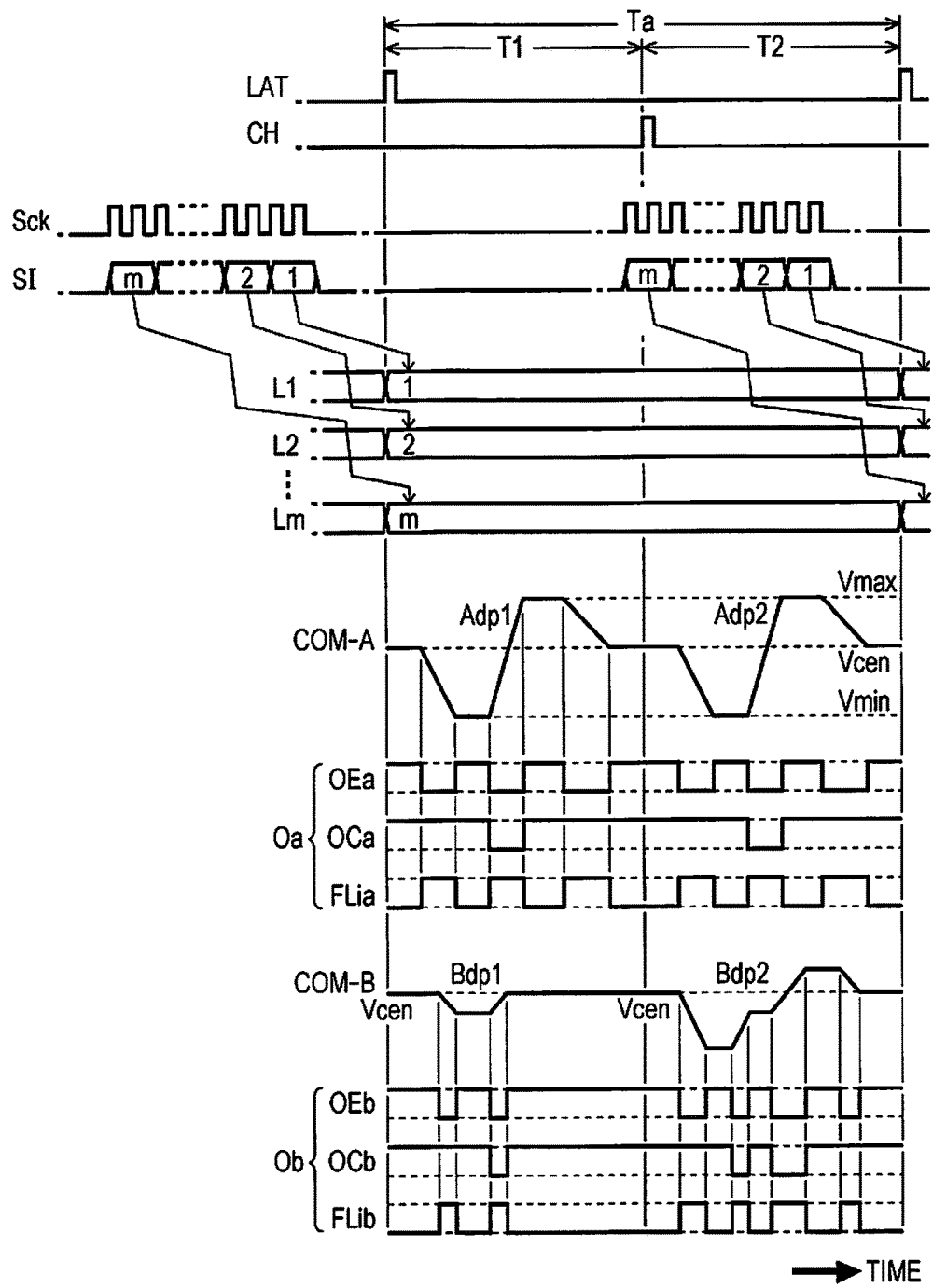
FIG. 6 is a diagram illustrating waveforms or the like of drive signals.

FIG. 6 is a diagram illustrating waveforms or the like of drive signals COM-A and COM-B.

As illustrated in FIG. 6, the drive signal COM-A is configured by a repeated waveform of a trapezoidal waveform Adp1 which is disposed during a period T1 from time when a control signal LAT is output (rises) to time when a control signal CH is output, during a print cycle Ta, and a trapezoidal waveform Adp2 which is disposed during a period T2 from time when the control signal CH is output and to the control signal LAT is output during the print cycle Ta.

In the present embodiment, the trapezoidal waveforms Adp1 and Adp2 are approximately the same waveforms as each other, and are waveforms which eject ink of a predetermined amount, specifically, an approximately medium amount from the nozzle N corresponding to the piezoelectric elements Pzt, if each waveform is supplied to the drive electrode 76 which is one terminal of the piezoelectric elements Pzt.

The drive signal COM-B is configured by a repeated waveform of a trapezoidal waveform Bdp1 which is disposed during the period T1 and a trapezoidal waveform Bdp2 which is disposed during the period T2. In the present embodiment, the trapezoidal waveforms Bdp1 and Bdp2 are waveforms different form each other. Among these, the trapezoidal waveform Bdp1 is a waveform for preventing an increase of viscosity of ink by slightly vibrating the ink near the nozzle N. Accordingly, even if the trapezoidal waveform Bdp1 is supplied to the one terminal of the piezoelectric element Pzt, ink is not ejected from the nozzle N corresponding to the piezoelectric element Pzt. In addition, the trapezoidal waveform Bdp2 is a waveform different from the trapezoidal waveform Adp1 (Adp2). If the trapezoidal waveform Bdp2 is supplied to the one terminal of the piezoelectric element Pzt, the trapezoidal waveform Bdp2 becomes a waveform which ejects the amount of ink less than the predetermined amount from the nozzle N corresponding to the piezoelectric element Pzt.

Voltages at a start timing of the trapezoidal waveforms Adp1, Adp2, Bdp1, and Bdp2, and voltages at an end timing of the trapezoidal waveforms Adp1, Adp2, Bdp1, and Bdp2 are all common at a voltage Vcen. That is, the trapezoidal waveforms Adp1, Adp2, Bdp1, and Bdp2 are waveforms which respectively start at the voltage Vcen and ends at the voltage Vcen.

In addition, a voltage maximum value of the trapezoidal waveforms Adp1 and Adp2 is conveniently denoted as Vmax, and a voltage minimum value of the trapezoidal waveforms Adp1 and Adp2 is conveniently denoted as Vmin.

Since the drive circuit 120a (120b) performs impedance conversion of the signal Ain (Bin) in the present example, a waveform of the signal Ain (Bin) which is input includes a slight error, but is the same as a waveform of the drive signal COM-A (COM-B). Meanwhile, since the signal Ain (Bin) is obtained by amplifying a voltage of the signal ain (bin) by 10 times, a waveform of the signal ain (bin) is in a relationship of $\frac{1}{10}$ of the voltage of the signal Ain (Bin). Since the signal ain (bin) is obtained by analog conversion of the data dA (dB), a voltage waveform of the drive signal COM-A (COM-B) is defined by the control unit 110.

The control unit 110 supplies each of the signals OEa, OCa, and FLia having the following logic levels to the drive circuit 120a in accordance with a trapezoidal waveform of the drive signal COM-A.

In detail, firstly, the control unit 110 sets the signal OEa to an L level during a period in which the voltage of the drive signal COM-A (signal ain) decreases and a period in which the voltage of the drive signal COM-A (signal ain) increases, and sets the signal OEa to an H level during the other periods in which the voltage of the drive signal COM-A is constant. In other words, the signal OEa is at an L level during a period in which the voltage of the trapezoidal waveform of the drive signal COM-A changes, and the signal OEa is at an H Level during a period in which the voltage of the trapezoidal waveform of the drive signal COM-A is constant.

Secondly, the control unit 110 sets the signal OCa to an L level during the period in which the voltage of the drive signal COM-A increases and sets the signal OCa to an H level during the other periods. Thereby, the signal OEa goes to an H level during the period in which the voltage is constant in the trapezoidal waveform of the drive signal COM-A, and the signal OEa goes to an L level during a period in which the voltage changes. Furthermore, the signal OCa goes to an H level during the period in which the voltage decreases, and the signal OCa goes to an L Level during the period in which the voltage increases, among the periods in which the voltage of the drive signal COM-A changes (that is, the period in which the signal OEa is at an L level).

Thirdly, the control unit 110 sets the signal FLia to an H level during the period in which the voltage of the drive signal COM-A decreases and the period in which the voltage of the drive signal COM-A increases and sets the signal FLia to an L level during the other periods in which the voltage of the drive signal COM-A is constant. A signal obtained by inverting a logic level of the signal OEa by using a NOT circuit or the like can be used as the signal FLia, but in this description, the control unit 110 supplies the signal as another signal.

In the same manner, the control unit 110 supplies each of the signals OEb, OCb, and FLib having the following logic levels to the drive circuit 120b in accordance with a trapezoidal waveform of the drive signal COM-B.

In detail, firstly, the control unit 110 sets the signal OEb to an L level during a period in which the voltage of the drive signal COM-B (signal bin) decreases and during a period in which the voltage of the drive signal COM-B increases, and sets the signal OEb to an H level during the other periods in which the voltage of the drive signal COM-B is constant.

Secondly, the control unit 110 sets the signal OCb to an L level during the period in which the voltage of the drive signal COM-B increases, and sets the signal OCb to an H level during the other periods.

Thirdly, the control unit 110 sets the signal FLib to an H level during the period in which the voltage of the drive signal COM-B decreases and the period in which the voltage of the drive signal COM-B increases and sets the signal FLib to an L level during the other periods in which the voltage of the drive signal COM-B is constant.

Figure 7:
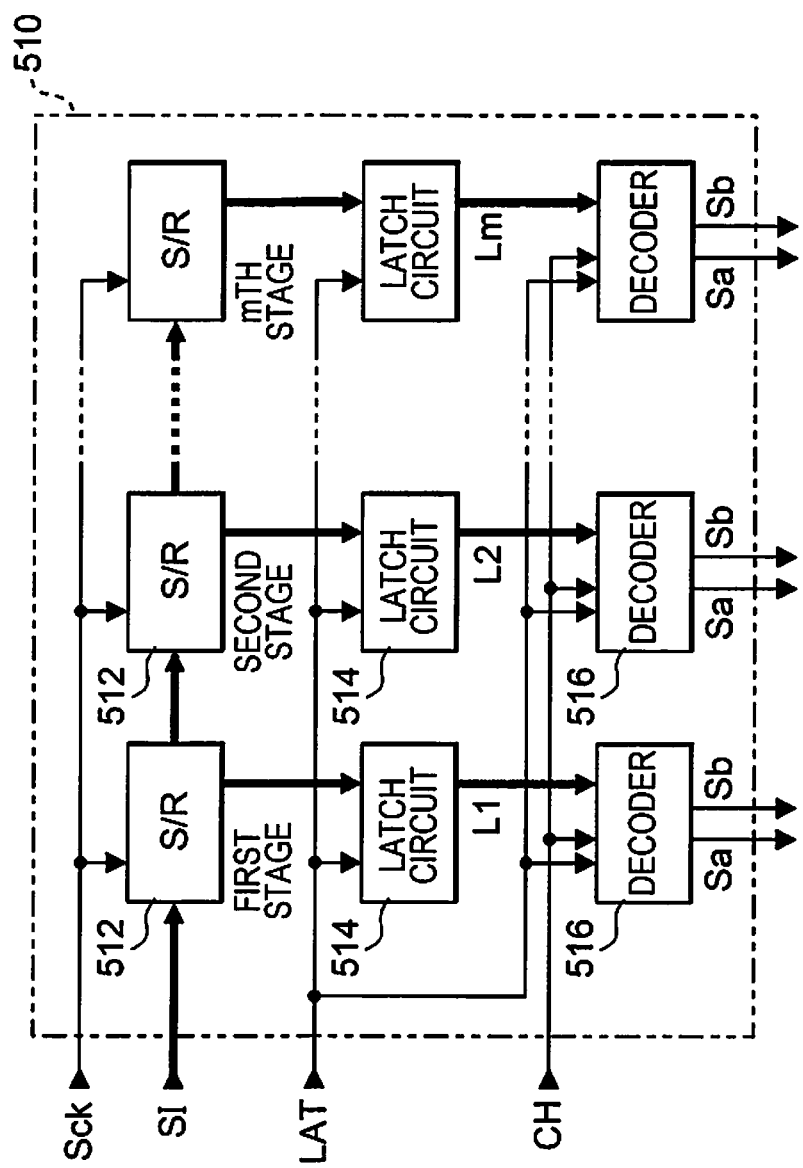
FIG. 7 is a diagram illustrating a configuration of a select control unit.

FIG. 7 is a diagram illustrating a configuration of the select control unit 510 of FIG. 5.

As illustrated in FIG. 7, a clock signal Sck, the print data SI, and the control signals LAT and CH are supplied to the select control unit 510. Multiple sets of a shift register (S/R) 512, a latch circuit 514, and a decoder 516 are provided in correspondence with each of the piezoelectric elements Pzt (nozzles N) in the select control unit 510.

The print data SI is data which defines dots to be formed by all the nozzles N in the head unit 3 which is focused during the print cycle Ta. In the present embodiment, in order to represent the four gradations of no record, a small dot, a medium dot, and a large dot, the print data for one nozzle is configured by two bits of a most significant bit (MSB) and a least significant bit (LSB).

The print data SI is supplied from the control unit 110 in accordance with transport of the medium P for each nozzle N (piezoelectric element Pzt) in synchronization with the clock signal Sck. The shift register 512 has a configuration in which the print data SI of two bits is held once in correspondence with the nozzle N.

In detail, shift registers 512 of total m stages corresponding to each of m piezoelectric elements Pzt (nozzles) are coupled in cascade, and the print data SI which is supplied to the shift register 512 of a first stage located at a left end of FIG. 7 is sequentially transmitted to the rear stage (downward side) in accordance with the clock signal Sck.

In FIG. 7, in order to separate the shift registers 512, the shift register 512 are sequentially referred to as a first stage, a second stage, . . . , an mth stage from an upper side to which the print data SI is supplied.

The latch circuit 514 latches the print data SI held in the shift register 512 at a rising edge of the control signal LAT.

The decoder 516 decodes the print data SI of two bits which are latched in the latch circuit 514, outputs select signals Sa and Sb for each of periods T1 and T2 which are defined by the control signal LAT and the control signal CH, and defines select of the select unit 520.

Figures 8, 9:
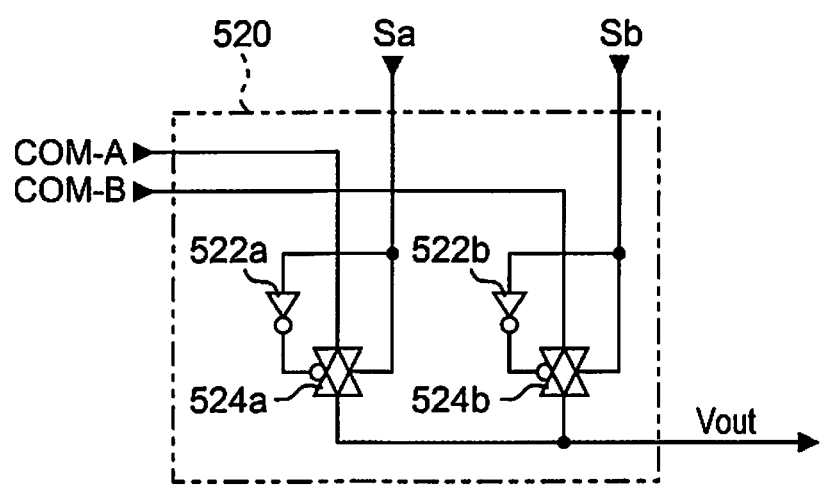
FIG. 8 is a diagram illustrating decoded contents of a decoder.
FIG. 9 is a diagram illustrating a configuration of a select unit.

FIG. 8 is a diagram illustrating decoded content of the decoder 516.

In FIG. 8, the print data SI of two bits which are latched is referred to as an MSB and an LSB. In the decoder 516, if the latched print data SI is (0,1), it means that logic levels of the select signals Sa and Sb are respectively output as levels of H and L during the period T1, and levels of L and H during the period T2.

The logic levels of the select signals Sa and Sb are level-shifted by a level shifter (not illustrated) to a higher amplitude logic than the logic levels of the clock signal Sck, the print data SI, and the control signals LAT and CH.

FIG. 9 is a diagram illustrating a configuration of the select unit 520 of FIG. 5.

As illustrated in FIG. 9, the select unit 520 includes inverters (NOT circuit) 522a and 522b, and transfer gates 524a and 524b.

The select signal Sa from the decoder 516 is supplied to a positive control terminal to which a round mark is not attached in the transfer gate 524a, is logically inverted by the inverter 522a, and is supplied to a negative control terminal to which a round mark is attached in the transfer gate 524a. In the same manner, the select signal Sb is supplied to a positive control terminal of the transfer gate 524b, is logically inverted by the inverter 522b, and is supplied to a negative control terminal of the transfer gate 524b.

The drive signal COM-A is supplied to an input terminal of the transfer gate 524a, and the drive signal COM-B is supplied to an input terminal of the transfer gate 524b. The output terminals of the transfer gates 524a and 524b are coupled to each other, and are coupled to one terminal of the corresponding piezoelectric element Pzt.

If the select signal Sa goes to an H level, the input terminal and the output terminal of the transfer gate 524a are electrically coupled (ON) to each other. If the select signal Sa goes to an L level, the input terminal and the output terminal of the transfer gate 524a are electrically decoupled (OFF) from each other. In the same manner, the input terminal and the output terminal of the transfer gate 524b are also electrically coupled to each other or decoupled from each other in accordance with the select signal Sb.

As illustrated in FIG. 6, the print data SI is supplied to each nozzle in synchronization with the clock signal Sck, and is sequentially transmitted to the shift registers 512 corresponding to the nozzles. Thus, if supply of the clock signal Sck is stopped, the print data SI corresponding to each nozzle is held in each of the shift registers 512.

If the control signal LAT rises, each of the latch circuits 514 latches all of the print data SI held in the shift registers 512. In FIG. 6, the number in L1, L2, . . . , Lm indicate the print data SI which is latched by the latch circuits 514 corresponding to the shift registers 512 of the first stage, the second stage, . . . , the mth stage.

The decoder 516 outputs the logic levels of the select signals Sa and Sb in the content illustrated in FIG. 8 in accordance with the size of the dots which are defined by the latched print data SI during the periods T1 and T2.

That is, first, the decoder 516 sets the select signals Sa and Sb to levels of H and L during the period T1 and levels of H and L even during the period T2, if the print data SI is (1,1) and the size of the large dot is defined. Second, the decoder 516 sets the select signals Sa and Sb to levels of H and L during the period T1 and levels of L and H during the period T2, if the print data SI is (0,1) and the size of the medium dot is defined. Third, the decoder 516 sets the select signals Sa and Sb to levels of L and L during the period T1 and levels of L and H during the period T2, if the print data SI is (1,0) and the size of the small dot is defined. Fourth, the decoder 516 sets the select signals Sa and Sb to levels of L and H during the period T1 and levels of L and L during the period T2, if the print data SI is (0,0) and no record is defined.

Figure 10:
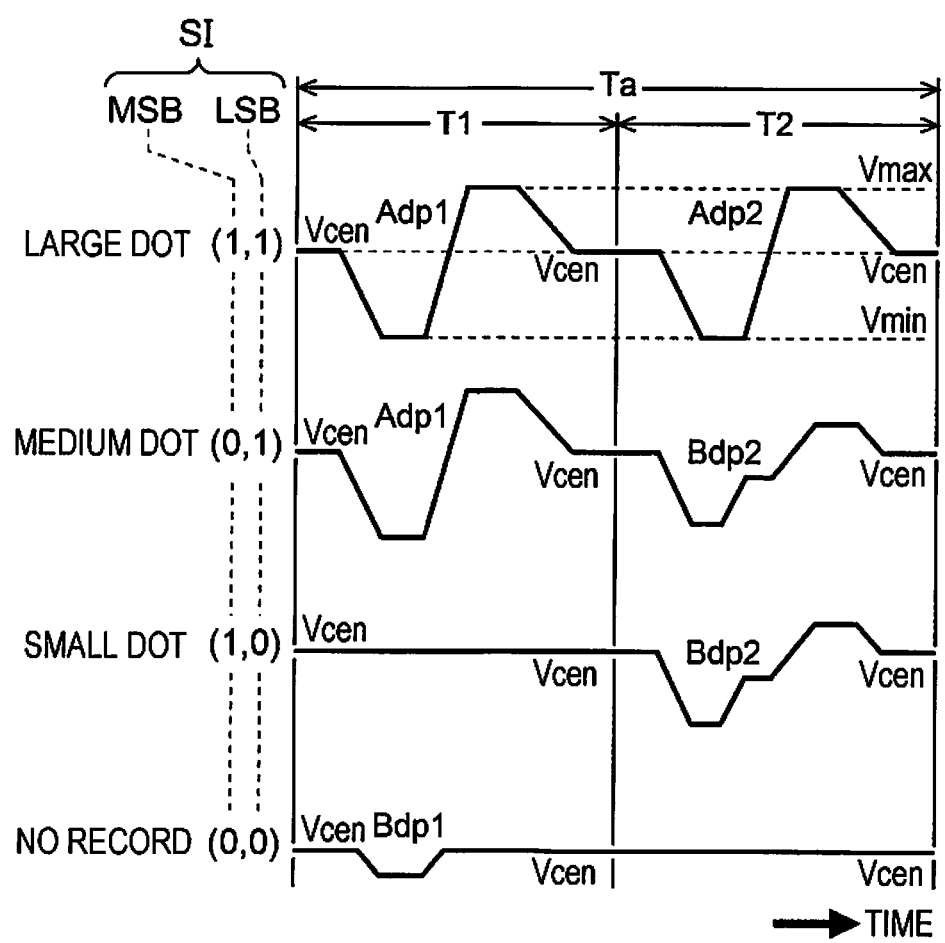
FIG. 10 is a diagram illustrating the drive signals supplied from the select unit to a piezoelectric element.

FIG. 10 is a diagram illustrating voltage waveforms of the drive signals which are selected in accordance with the print data SI and are supplied to one terminal of the piezoelectric element Pzt.

When the print data SI is (1,1), the select signals Sa and Sb become H and L levels during the period T1, and thus the transfer gate 524a is turned on, and the transfer gate 524b is turned off. Accordingly, the trapezoidal waveform Adp1 of the drive signal COM-A is selected during the period T1. Since the select signals Sa and Sb go to H and L levels even during the period T2, the select unit 520 selects the trapezoidal waveform Adp2 of the drive signal COM-A.

In this way, if the trapezoidal waveform Adp1 is selected during the period T1, the trapezoidal waveform Adp2 is selected during the period T2, and the selected waveforms are supplied to one terminal of the piezoelectric element Pzt as drive signals, ink of an approximately medium amount is ejected twice from the nozzle N corresponding to the piezoelectric element Pzt. Accordingly, each ink is landed on and combined with the medium P, and as a result, a large dot is formed as defined by the print data SI.

When the print data SI is (0,1), the select signals Sa and Sb become H and L levels during the period T1, and thus the transfer gate 524a is turned on, and the transfer gate 524b is turned off. Accordingly, the trapezoidal waveform Adp1 of the drive signal COM-A is selected during the period T1. Next, since the select signals Sa and Sb go to L and H levels during the period T2, the trapezoidal waveform Bdp2 of the drive signal COM-B is selected.

Hence, ink of an approximately medium amount and an approximately small amount is ejected twice from the nozzle N. Accordingly, each ink is landed on and combined with the medium P, and as a result, a medium dot is formed as defined by the print data SI.

When the print data SI is (1,0), the select signals Sa and Sb become all L levels during the period T1, and thus the transfer gates 524a and 524b are turned off. Accordingly, the trapezoidal waveforms Adp1 and Bdp1 are not selected during the period T1. If the transfer gates 524a and 524b are all turned off, a path from a coupling point of the output terminals of the transfer gates 524a and 524b to one terminal of the piezoelectric element Pzt becomes a high impedance state in which the path is not electrically coupled to any portion. However, both terminals of the piezoelectric element Pzt hold a voltage (Vcen-$V_{BS}$) shortly before the transfer gates are turned off, by capacitance included in the piezoelectric element Pzt itself.

Next, since the select signals Sa and Sb go to L and H levels during the period T2, the trapezoidal waveform Bdp2 of the drive signal COM-B is selected. Accordingly, ink of an approximately small amount is ejected from the nozzle N only during the period T2, and thus small dot is formed on the medium P as defined by the print data SI.

When the print data SI is (0,0), the select signals Sa and Sb become L and H levels during the period T1, and thus the transfer gates 524a is turned off and the transfer gate 524b is turned on. Accordingly, the trapezoidal waveforms Bdp1 of the drive signal COM-B is selected during the period T1. Next, since all of the select signals Sa and Sb go to L levels during the period T2, the trapezoidal waveforms Adp2 and Bdp2 are all not selected.

Accordingly, ink near the nozzle N just slightly vibrates during the period T1, and the ink is not ejected, and thus, as a result, dots are not formed, that is, no record is made as defined by the print data SI.

In this way, the select unit 520 selects (or does not select) the drive signals COM-A and COM-B in accordance with instruction of the select control unit 510, and applies the selected signal to one terminal of the piezoelectric element Pzt. Accordingly, each of the piezoelectric elements Pzt is driven in accordance with the size of the dot which is defined by the print data SI.

The drive signals COM-A and COM-B illustrated in FIG. 6 are just an example. Actually, combinations of various waveforms which are prepared in advance are used in accordance with properties, transport speed, or the like of the medium P.

In addition, here, an example in which the piezoelectric element Pzt is bent upwardly in accordance with a decrease of a voltage is used, but if a voltage which is applied to the drive electrodes 72 and 76 is inverted, the piezoelectric element Pzt is bent downwardly in accordance with a decrease of the voltage. Accordingly, in a configuration in which the piezoelectric element Pzt is bent downwardly in accordance with a decrease of a voltage, the drive signals COM-A and COM-B illustrated in the figure have waveforms which are inverted by using the voltage Vcen as a reference.

Next, the drive circuits 120a and 120b in the circuit substrate 50 will be described.

Since there are several aspects in the drive circuits 120a and 120b, there is a case where parentheses including words are given instead of the symbols, such as the drive circuit (first circuit) or the drive circuit (second circuit) so as to distinguish from each other.

First, the drive circuit (first circuit) will be described by using the drive circuit 120a that outputs the drive signal COM-A as an example.

Figure 11:
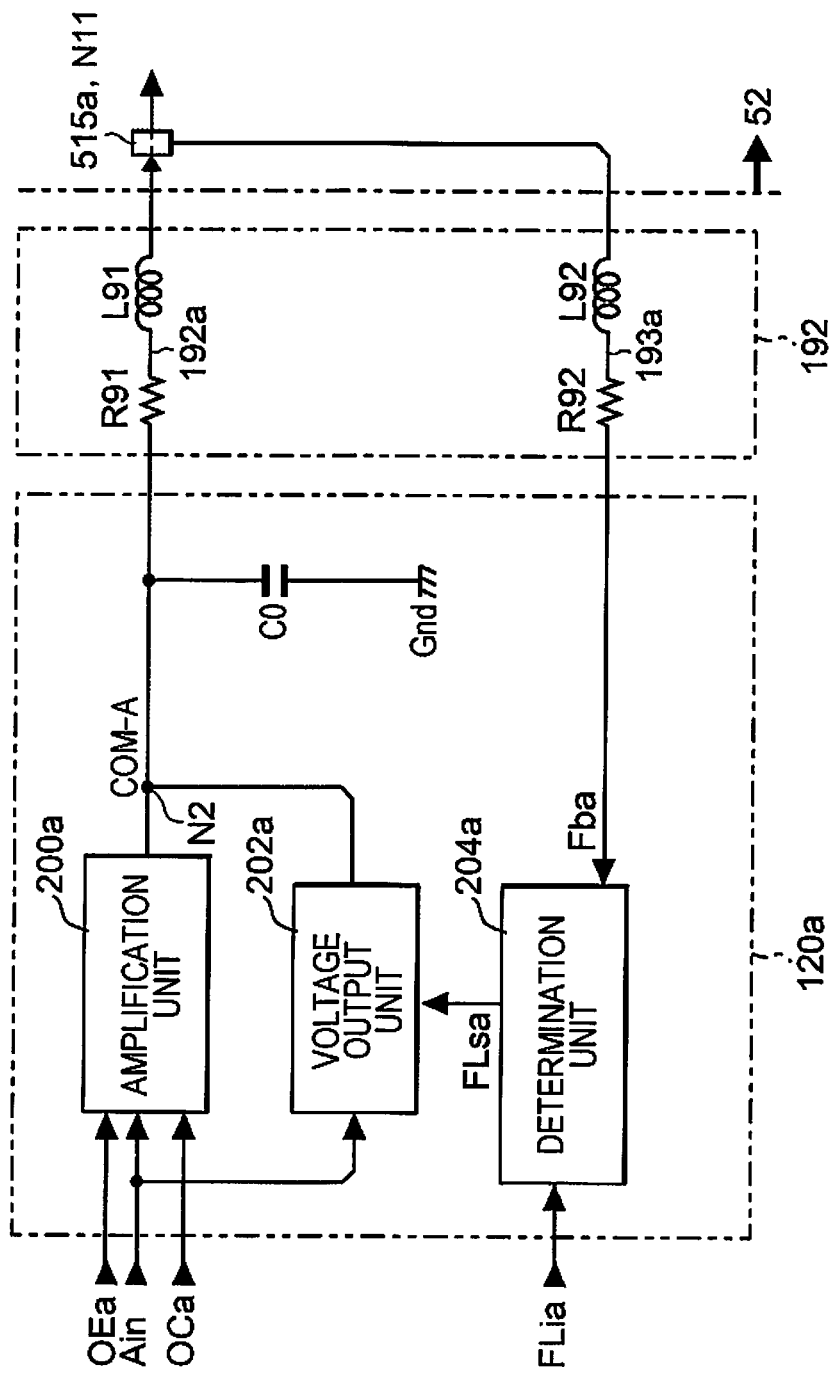
FIG. 11 is a diagram illustrating a configuration of a drive circuit (first circuit) applied to the printing apparatus (first apparatus).

FIG. 11 is a diagram illustrating the drive circuit 120a and a peripheral circuit thereof.

As illustrated in FIG. 11, the drive circuit 120a includes an amplification unit 200a, a voltage output unit 202a, a determination unit 204a, and a capacitor C0.

The amplification unit 200a outputs a signal obtained by converting the signal Ain into a signal with a low impedance based on the signals OEa and OCa in the signal group Oa.

The voltage output unit 202a outputs a signal obtained by amplifying the signal Ain by a voltage amplification factor of 1, when a signal FLsa is at an L level.

A node N2 is a common coupling portion between an output terminal of the amplification unit 200a and an output terminal of the voltage output unit 202a, and is coupled to the conversion unit 515a (node N11) of the COF 52 through a wire 192a (first wire) of the flexible flat cable 192.

One terminal of the capacitor C0 is coupled to the node N2, and the other terminal of the capacitor C0 is coupled to a constant potential, for example, a ground Gnd.

A node N11 is a current detection point of the drive signal COM-A in the conversion unit 515a and is located in front of an input terminal of the select unit 520 in the COF 52 as viewed from the drive circuit 120a. The signal Fba of a voltage converted by the conversion unit 515a is fed back to the drive circuit 120a through a wire 193a (second wire) of the flexible flat cable 192.

The determination unit 204a outputs a signal FLsa based on the signal FLia and the signal Fba in the signal group Oa.

In the wire 192a from the node N2 to the node N11 in FIG. 11, a resistance component is R91 and an inductance component is L91. In the same manner, in the wire 193a from the node N11 to one terminal of the capacitor C31, a resistance component is R92 and an inductance component is L92.

Figure 12:
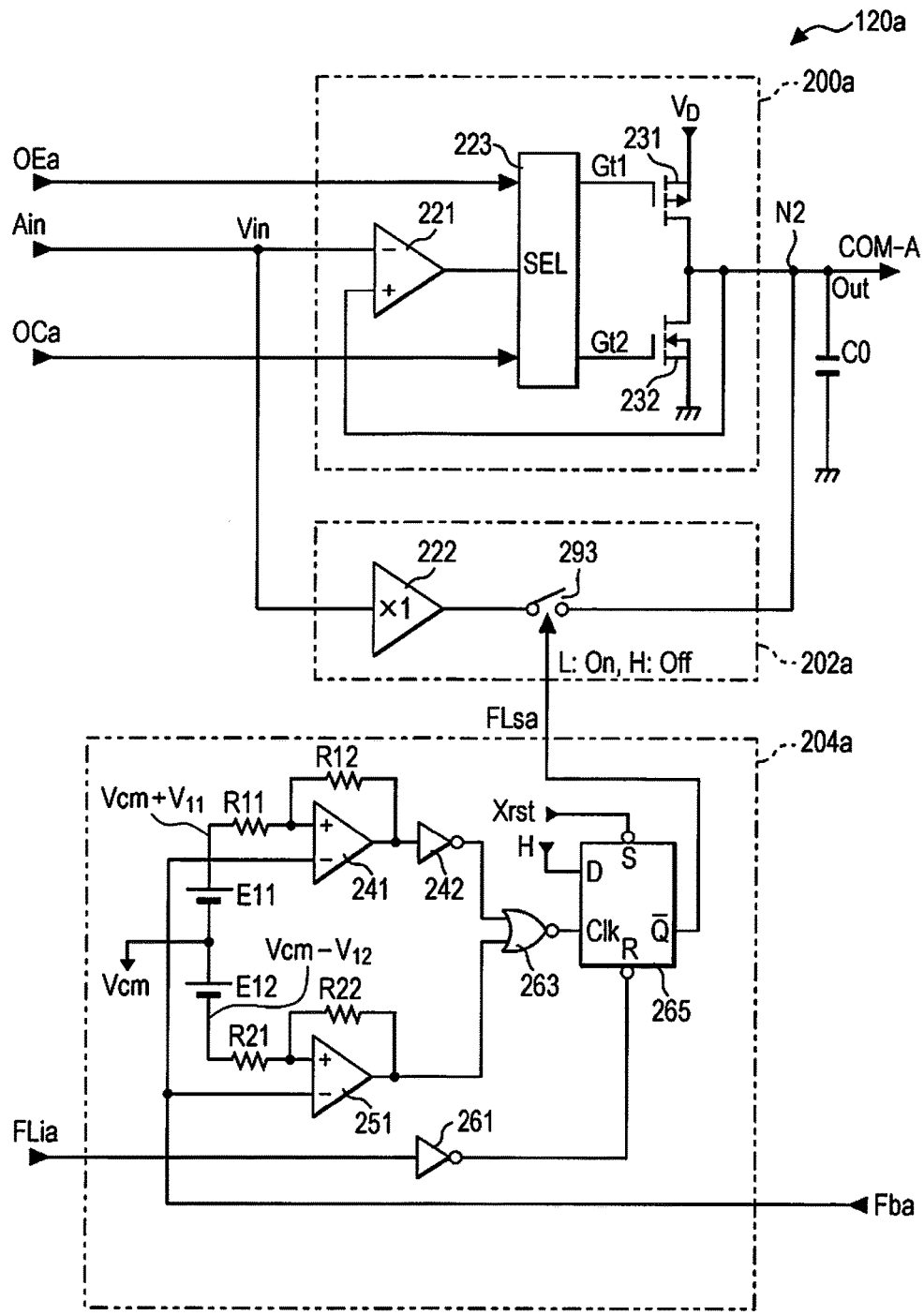
FIG. 12 is a diagram illustrating a detailed configuration of the drive circuit (first circuit).

FIG. 12 is a diagram illustrating detailed configurations of each of the amplification unit 200a, the voltage output unit 202a, and the determination unit 204a in the drive circuit 120a.

First, the amplification unit 200a includes a differential amplifier 221, a selector 223, and a pair of transistors.

The differential amplifier 221 has a negative input terminal (−) to which the signal Ain is supplied and a positive input terminal (+) to which the drive signal COM-A is fed back. Accordingly, the differential amplifier 221 amplifies a differential voltage obtained by subtracting a voltage of the negative input terminal (−) from a voltage of the positive input terminal (+), that is, a differential voltage obtained by subtracting a voltage Vin of the signal Ain (original drive signal) from a voltage Out of the drive signal COM-A which is an output, and outputs the amplified differential voltage.

While not illustrated in particular, for example, a high side of the power supply is set to a voltage $V_D$ (=42 V) and a low side thereof is set to a ground Gnd (=0 V) for the differential amplifier 221. Accordingly, an output voltage ranges between the ground Gnd and the voltage $V_D$.

In addition, since there is a case where the original drive signal is voltage-amplified to be output as the drive signal while the drive signal COM-A is fed back after a voltage thereof decreases, it may be said that a signal based on the drive signal is fed back to the differential amplifier 221, in the drive circuit 120a.

If the signal OEa is at an L level and the signal OCa is at an L level, the selector (select unit) 223 selects the output signal of the differential amplifier 221 as a signal Gt1 to supply to a gate terminal of the transistor 231 and selects the L level as a signal Gt2 to supply to a gate terminal of the transistor 232.

Meanwhile, if the signal OEa is at an L level and the signal OCa is at an H level, the selector 223 selects the H level as the signal Gt1 to supply to the gate terminal of the transistor 231, and selects the output signal of the differential amplifier 221 as the signal Gt2 to supply to the gate terminal of the transistor 232.

If the signal OEa is at an H level, the selector 223 supplies the H level to the gate terminal of the transistor 231 as the signal Gt1 and supplies the L level to the gate terminal of the transistor 232 as the signal Gt2, regardless of a logic level of the signal OCa.

In other words, firstly, if the drive signal COM-A (signal Ain) is in a voltage increasing period, the selector 223 supplies the output signal of the differential amplifier 221 to the gate terminal of the transistor 231, and supplies a signal for turning off the transistor 232 to the gate terminal of the transistor 232. Secondly, if the drive signal COM-A is in a voltage decreasing period, the selector 223 supplies a signal for turning off the transistor 231 to the gate terminal of the transistor 231 and supplies the output signal of the differential amplifier 221 to the gate terminal of the transistor 232. Thirdly, if the drive signal COM-A is in a flat voltage period, the selector 223 supplies a signal for turning off the transistor 231 to the gate terminal of the transistor 231 and supplies a signal for turning of the transistor 232 to the gate terminal of the transistor 232.

The pair of transistors are configured by transistors 231 and 232. Among those, a high side transistor 231 (a high side transistor) is, for example, a P-channel type field effect transistor, and the high side voltage $V_D$ of the power supply is applied to a source terminal thereof. A low side transistor 232 (a low side transistor) is, for example, an N-channel type field effect transistor, and a source terminal thereof is coupled to the ground Gnd which is a lower side of the power supply.

Drain terminals of the transistors 231 and 232 are coupled to each other and serve as the node N2 which is an output terminal of the drive circuit 120a. That is, the drive signal COM-A is configured to output from the node N2.

A voltage of the node N2 which is an output of the drive circuit 120a is denoted as Out and a voltage of the signal Ain which is an input thereof is denoted as Vin.

Next, the voltage output unit 202a includes a linear amplifier 222 and a switch 293.

The linear amplifier 222 amplifies the voltage Vin of the signal Ain by a voltage amplification factor of 1 and outputs the amplified voltage in the present embodiment.

The switch 293 is located between an output terminal of the linear amplifier 222 and the node N2, is turned on if the signal FLsa is at an L level, and is turned off if the signal FLsa is at an H level.

The determination unit 204a includes reference power supplies E11 and E12, resistance elements R11, R12, R21, and R22, operational amplifiers 241 and 251, NOT circuits 242 and 261, a NOR circuit 263, and a D flip-flop (hereinafter, abbreviated as a "DFF") 265.

The reference power supply E11 (first offset unit) outputs a voltage V11 between ae positive terminal and a negative terminal. The reference power supply E11 has the negative terminal to which the voltage Vcm is applied and the positive terminal coupled to the positive input terminal (+) of the operational amplifier 241 through the resistance element R11. The voltage Vcm is, for example, 1.5 V.

Meanwhile, the signal Fba is input to the negative input terminal (−) of the operational amplifier 241. An output terminal of the operational amplifier 241 is positively fed back to the positive input terminal (+) of the operational amplifier 241 through the resistance element R12.

Accordingly, the operational amplifier 241 functions as a hysteresis comparator which compares a voltage of the signal Fba with a voltage (Vcm+V11). In detail, a voltage obtained by dividing an output voltage of the operational amplifier 241 by the resistance elements R11 and R12 becomes a hysteresis width, and when the voltage of the signal Fba is higher or lower than the voltage (Vcm+V11) by the hysteresis width, the output voltage of the operational amplifier 241 is inverted.

However, for the sake of simple description here, it is assumed that the operational amplifier 241 outputs an L level when the voltage of the signal Fba is higher than or equal to the voltage (Vcm+V11), and outputs an H level when the voltage of the signal Fba is lower than the voltage (Vcm+V11).

The output terminal of the operational amplifier 241 is coupled to an input terminal of the NOT circuit 242 and an output terminal of the NOT circuit 242 is coupled to one of the two input terminals of the NOR circuit 263.

The reference power supply E12 (second offset unit) outputs a voltage V12 between the positive terminal and the negative terminal. The reference power supply E12 has a positive terminal to which the voltage Vcm is applied and a negative terminal coupled to the positive input terminal (+) of the operational amplifier 251 through the resistance element R21.

Meanwhile, the signal Fba is input to the negative input terminal (−) of the operational amplifier 251. An output terminal of the operational amplifier 251 is positively fed back to the positive input terminal (+) of the operational amplifier 251 through the resistance element R22.

Accordingly, the operational amplifier 251 functions as a hysteresis comparator that inverts an output voltage thereof when a voltage of the signal Fba is higher or lower than a voltage (Vcm−V12) by the hysteresis width.

However, for the sake of simple description here, it is assumed that the operational amplifier 251 outputs an L level when the voltage of the signal Fba is higher than or equal to the voltage (Vcm−V12), and outputs an H level when the voltage of the signal Fba is lower than the voltage (Vcm−V12).

An output terminal of the operational amplifier 251 is coupled to the other input terminal of two input terminals of the NOR circuit 263.

An output terminal of the NOR circuit 263 is coupled to a clock input terminal Clk of the DFF 265.

The signal FLia is supplied to an input terminal of the NOT circuit 261, and an output terminal of the NOT circuit 261 is coupled to a negative logic reset input terminal R of the DFF 265.

An input terminal D of the DFF 265 is held at an H level, and a signal Xrst is supplied to a negative logic set input terminal S. The signal Xrst is held at an H level during an operation, but is a signal which goes to an L level for a predetermined period (for example, one second) when the system is reset at the time of supplying power, returning from an error or the like. For example, the signal Xrst is supplied from the control unit 110 through the flexible flat cable 190.

The signal FLsa is output from an output terminal /Q of the DFF 265. The DFF 265 actually has an output terminal Q for normal transfer but is omitted in FIG. 12. In addition, "/Q" means inversion of the normal transfer output terminal Q. The signal FLsa is the same as the above description in controlling turn-on and turn-off of the switch 293 in the voltage output unit 202a.

When a signal input to the clock input terminal Clk increases to an H level, the DFF 265 outputs an inverted signal of a level of the input terminal D from the output terminal /Q, while in a state where the set input terminal S is at an H level, when a reset input terminal R goes to an L level, a signal output from the output terminal /Q is set to an H level.

Accordingly, the DFF 265 is configured to set the signal FLsa output from the output terminal /Q to an H level and turn off the switch 293 when the signal FLia changes to an H level, and to invert the signal FLsa to an L level and turn on the switch 293 when a negative logical sum signal output from the NOR circuit 263 increases to an H level.

Here, ae case where the negative logical sum signal of the NOR circuit 263 is at an H level is a case where an output signal of the NOT circuit 242 is at an L level (that is, a case where the output signal of the operational amplifier 241 is at an H level), and a case where the output signal of the operational amplifier 251 is at an L level. The former case where the output signal of the operational amplifier 241 is at an H level is a case where a voltage of the signal Fba is lower than the voltage (Vcm+V11) as described above, and the latter case where the output signal of the operational amplifier 251 is an L level is a case where a voltage of the signal Fba is higher than or equal to the voltage (Vcm−V12) as described above.

Meanwhile, as described above, in a case where the current of the drive signal COM-A is zero, the signal Fba becomes the voltage Vcm, and in a case where the voltage of the drive signal COM-A increases, the signal Fba is higher than the voltage Vcm as the current of the drive signal COM-A increase, and the signal Fba is lower than the voltage Vcm as the current of the drive signal COM-A increases.

Hence, a case where the negative logical sum signal is changed from an L level to an H level by the NOR circuit 263 indicates a case where the voltage of the drive signal COM-A is constant after increasing or decreasing and thereafter ranges between a voltage lower than the voltage (Vcm+V11) and a voltage higher than or equal to the voltage (Vcm−V12).

Next, an operation of the drive circuit 120a will be described.

Figure 13:
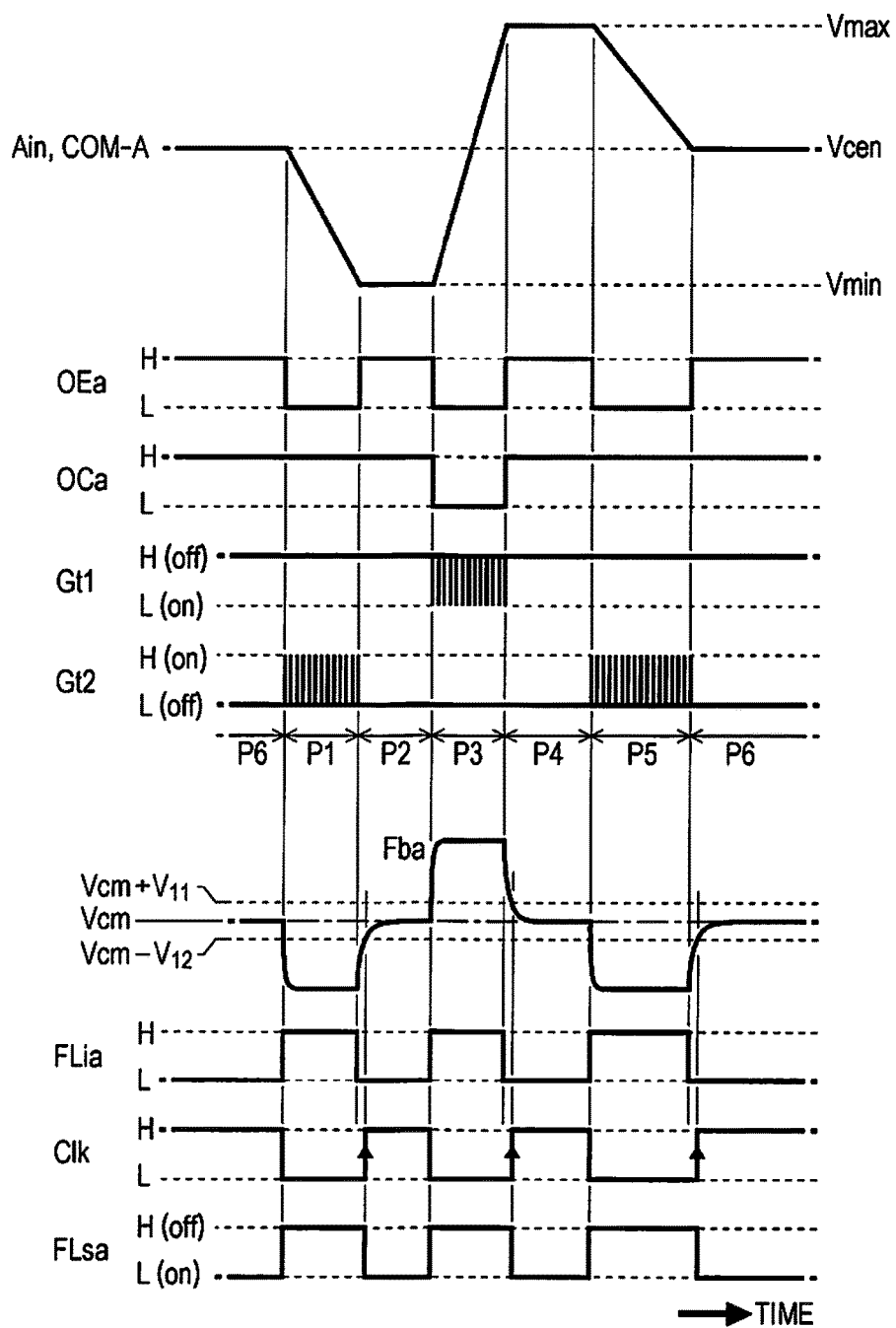
FIG. 13 is a diagram illustrating an operation of the drive circuit (first circuit).

FIG. 13 is a diagram illustrating voltage waveforms of each unit for describing the operation of the drive circuit 120a.

In FIG. 13, the signal Ain is a signal which is input before impedance conversion of the drive signal COM-A is performed, and thus, the signal Ain has approximately the same waveform as the drive signal COM-A. In addition, as described above, since the drive signal COM-A has two identical trapezoidal waveforms Adp1 and Adp2 repeated during the print cycle Ta, the signal Ain also has the same waveform which is repeated.

FIG. 13 illustrates one trapezoidal waveform of the waveforms which are repeated. In addition, in FIG. 13, a period P1 is a period in which the voltage Vin of the signal Ain decreases from the voltage Vcen to a voltage Vmin of the trapezoidal waveform, a period P2 following the period P1 is a period in which the voltage Vin is constant to the voltage Vmin, a period P3 following the period P2 is a period in which the voltage Vin increases from the voltage Vmin to a voltage Vmax, a period P4 following the period P3 is a period in which the voltage Vin is constant to the voltage Vmax, and a period P5 following the period P4 is a period in which the voltage Vin decreases from the voltage Vmax to the voltage Vcen.

A relationship between voltages of the drive signal COM-A is $V_D$>Vmax>Vcen>Vmin>Gnd.

In addition, A vertical scale is not always aligned for each of the plurality of voltage waveforms in FIG. 13, for the sake of convenient description.

First, the period P1 is a voltage decreasing period of the drive signal COM-A (Ain). Accordingly, the signal OEa is at an L level and the signal OCa is at an H level during the period P1, and thus, the selector 223 selects the H level as the signal Gt1 and selects an output signal of the differential amplifier 221 as the signal Gt2.

Since the signal Gt1 is at an H level during the period P1, the P-channel type transistor 231 is turned off.

Meanwhile, the voltage Vin of the signal Ain first decreases more than the voltage Out of the node N2 during the period P1. In other words, the voltage Out is higher than or equal to the voltage Vin. Accordingly, a voltage of the output signal of the differential amplifier 221 which is selected as the signal Gt2 increases in accordance with a differential voltage between both terminals and approximately jumps to an H level. If the signal Gt2 goes to an H level, the transistor 232 is turned on, and thereby, the voltage Out decreases. The voltage Out does not actually decreases to the ground Gnd at once due to the capacitor C0 and capacitance of the piezoelectric element Pzt which is a load, and decreases slowly.

If the voltage Out is lower than the voltage Vin, the signal Gt2 goes to an L level, and the transistor 232 is turned off. Although the transistor 232 is turned off, the voltage of the node N2 is held by the capacitor C0 and capacitances of the piezoelectric element Pzt, thereby, being not unstable.

If the transistor 232 is turned off, decrease of the voltage Out of the node N2 is stopped, but since the voltage Vin continuously decreases, the voltage Out is higher than or equal to the voltage Vin again. Accordingly, the signal Gt2 goes to an H level, and the transistor 232 is turned on again.

The signal Gt2 is alternately switched to an H level and an L level during the period P1, and thereby, the transistor 232 performs an operation of repeating turn-on and turn-off, that is, a switching operation. By the switching operation, the voltage Out is controlled to follow decrease of the voltage Vin.

In addition, since the voltage of the drive signal COM-A decreases at a substantially constant rate during the period P1, the signal Fba fluctuates to a negative side of the voltage Vcm. During the period P1, the signal FLia is at an H level. Accordingly, the DFF 265 sets the signal FLsa output from the output terminal /Q to an H level thereby turning off the switch 293. Accordingly, during the period P1, an output of the linear amplifier 222 does not influence the drive signal COM-A from the node N2.

Next, the period P2 is a period in which the drive signal COM-A (Ain) is constant at the voltage Vmin. Accordingly, since the signal OEa is at an H level during the period P2, the selector 223 selects an H level as the signal Gt1 and selects an L level as the signal Gt2, and as a result, both the transistors 231 and 232 are turned off.

In addition, since the voltage of the drive signal COM-A changes from a decreasing state to a constant state at a start timing of the period P2, the signal Fba is directed toward the voltage Vcm. Here, when the signal Fba ranges between a voltage lower than the voltage (Vcm+V11) and a voltage higher than or equal to the voltage (Vcm−V12), the signal FLsa output from the output terminal /Q of the DFF 265 falls to an L level. Thereby, since the switch 293 is turned on, an output signal of the linear amplifier 222, that is, a signal obtained by amplifying the voltage Vin of the signal Ain by one time is supplied to the node N2. Accordingly, the voltage Out becomes the voltage Vin.

The period P3 is a voltage increasing period of the drive signal COM-A (Ain). Accordingly, the signal OEa goes to an L level and the signal OCa goes to an L level during the period P3, and thereby, the selector 223 selects the output signal of the differential amplifier 221 as the signal Gt1 and selects the L level as the signal Gt2.

Since the signal Gt2 is at an L level during the period P3, the N-channel type transistor 232 is turned off.

Meanwhile, the voltage Vin increases prior to the voltage Out during the period P3. In other words, the voltage Out decreased more than the voltage Vin. Accordingly, a voltage of the output signal of the differential amplifier 221 selected as the signal Gt1 decreases in accordance with the differential voltage between both terminals and approximately jumps to an L level. If the signal Gt1 goes to an L level, the transistor 231 is turned on, and thereby, the voltage Out increases. The voltage Out does not actually increases to the voltage $V_D$ at once due to the capacitor C0 and the piezoelectric element Pzt, and decreases slowly.

If the voltage Out is higher than or equal to the voltage Vin, the signal Gt2 goes to an H level, and the transistor 231 is turned off. Although the transistor 231 is turned off, the voltage of the node N2 is held by the capacitor C0 and the capacitances of the piezoelectric element Pzt, thereby, being not unstable.

If the transistor 231 is turned off, increase of the voltage Out is stopped, but since the voltage Vin continuously increases, the voltage Out is lower than the voltage Vin again. Accordingly, the signal Gt1 goes to an L level, and the transistor 231 is turned on again.

The signal Gt1 is alternately switched to an H level and an L level during the period P3, and thereby, the transistor 231 performs the switching operation. By the switching operation, the voltage Out is controlled to follow increase of the voltage Vin.

In addition, since the voltage of the drive signal COM-A increases at a substantially constant rate during the period P3, the signal Fba fluctuates to a positive side of the voltage Vcm. During the period P3, the signal FLia is at an H level. Accordingly, the DFF 265 sets the signal FLsa output from the output terminal /Q to an H level thereby, turning off the switch 293. Accordingly, during the period P3, the output of the linear amplifier 222 does not influence the drive signal COM-A from the node N2.

The period P4 is a period in which the drive signal COM-A (Ain) is constant at the voltage Vmax. Accordingly, since the signal OEa is at an H level during the period P4, the selector 223 selects the H level as the signal Gt1 and selects the L level as the signal Gt2, and as a result, both the transistors 231 and 232 are turned off.

In addition, since the voltage of the drive signal COM-A changes from an increasing state to a constant state at a start timing of the period P4, the signal Fba is directed toward the voltage Vcm. Here, when the signal Fba ranges between a voltage lower than the voltage (Vcm+V11) and a voltage higher than or equal to the voltage (Vcm−V12), the signal FLsa output from the output terminal /Q of the DFF 265 falls to an L level. Thereby, since the switch 293 is turned on, the output signal of the linear amplifier 222 is supplied to the node N2, and as a result, the voltage Out becomes the voltage Vin.

The period P5 is a voltage decreasing period of the drive signal COM-A (Ain). Accordingly, the same operation as in the period P1 is performed during the period P5. That is, the signal Gt2 is alternately switched to an H level and an L level, and thereby, the transistor 232 performs the switching operation and the voltage Out is controlled to follow decrease of the voltage Vin.

In addition, since the signal Fba fluctuates to a negative side of the voltage Vcm and the signal FLia is at an H level during the period P5, the DFF 265 turns off the switch 293. Accordingly, during the period P5, the output of the linear amplifier 222 does not influence the drive signal COM-A from the node N2.

A period P6 after the period P5 is a period in which the drive signal COM-A (Ain) is constant at the voltage Vcen. Accordingly, since the signal OEa is at an H level during the period P6, the selector 223 selects the H level as the signal Gt1 and selects the L level as the signal Gt2, and as a result, both the transistors 231 and 232 are turned off.

In addition, since the voltage of the drive signal COM-A changes from a decreasing state to a constant state at a start timing of the period P6, the signal Fba is directed toward the voltage Vcm. When the signal Fba ranges between a voltage lower than the voltage (Vcm+V11) and a voltage higher than or equal to the voltage (Vcm−V12), the signal FLsa output from the output terminal /Q of the DFF 265 falls to an L level. Thereby, since the switch 293 is turned on, the output signal of the linear amplifier 222 is supplied to the node N2, and as a result, the voltage Out becomes the voltage Vin.

According to the drive circuit 120a illustrated in FIG. 11 and FIG. 12, the following operation is performed during each of the periods P1 to P6.

That is, the voltage Out is controlled to follow the voltage Vin during the periods P1 and P5 in which the voltage Vin decreases by the switching operation of the transistor 232, and the voltage Out is controlled to follow the voltage Vin during the period P3 in which the voltage Vin increases by the switching operation of the transistor 231.

In addition, the voltage Vin of the signal Ain is amplified by the linear amplifier 222 instead of the transistors 231 and 232 by a voltage amplification factor of 1 and is output as the voltage Out during the periods P2, P4, and P6 in which the voltage Vin is constant.

Description is made in which, in the drive circuit 120a, the transistor 231 performs a switching operation during the period P3 in which the voltage Vout (voltage Vin of the signal Ain) of the drive signal COM-A increases, and the transistor 232 performs a switching operation during the periods P1 and P5 in which the voltage Vout decreases, but in a case where the number of coupled piezoelectric elements Pzt is large, a linear operation may occur due to a relationship of a time constant determined by ON resistance of the transistor and load capacitance. The linear operation of the transistor described here indicates an operation in which the output signal of the differential amplifier 221 is supplied to a gate terminal and the transistor causes a current corresponding to a voltage difference between the gate terminal and a source terminal to flow between the source terminal and a drain terminal.

According to the drive circuit 120a, the transistors 231 and 232 do not perform the switching operation during the periods P2, P4, and P6 in which the voltage Vin is constant, as compared with D-class amplification in which switching is always performed. In addition, an a low pass filter (LPF) which demodulates a switching signal, particularly an inductor such as a coil is required in the D-class amplification, but such the drive circuit 120a does not require the LPF. Accordingly, according to the drive circuit 120a, it is possible to reduce power consumed in the switching operation and the LPF, compared to the D-class amplification, and to simplify and miniaturize a circuit.

In addition, the voltage Out is controlled to follow decrease of the voltage Vin by the switching operation of the transistor 231 or 232 during a voltage changing period of the drive signal COM-A (Ain).

Meanwhile, both the transistors 231 and 232 are turned off during a constant voltage period of the drive signal COM-A (Ain), but the switch 293 is turned on, and the linear amplifier 222 amplifies the signal Ain by a voltage amplification factor of 1 and outputs the amplified signal to the node N2 as the voltage Out. Accordingly, although the transistors 231 and 232 are turned off, the voltage Out of the node N2 is stabilized at the voltage Vin.

The drive circuit 120a has a configuration in which, when the voltage of the drive signal COM-A changes from an increasing state or a decreasing state to a constant state, the switch 293 is not turned on immediately, and when the signal Fba ranges between a voltage lower than the voltage (Vcm+V11) and a voltage higher than or equal to the voltage (Vcm−V12), the switch is turned on.

Hereinafter, a reason why the configuration is adopted will be described.

As previously described, the resistance component R91 and the inductance component L91 are parasitic in the wire 192a from the node N2 of the drive circuit 120a to the node N11 of the COF 52. Among those, the inductance component L91 acts in a direction to delay a current waveform of the drive signal COM-A with respect to a voltage waveform, and thus, although the voltage of the drive signal COM-A changes from an increase state or a decreases state to a constant state, a current of the node N11 does not immediately decrease to zero.

Accordingly, there is a case where a relatively large current still flows shortly after the voltage of the drive signal COM-A changes, for example, from a decrease state to a constant state. In such a case, if the switch 293 is turned on, spike noise is superimposed on the drive signal COM-A as illustrated in FIG. 25, and thereby, accuracy of liquid ejection deteriorates.

Figure 25:
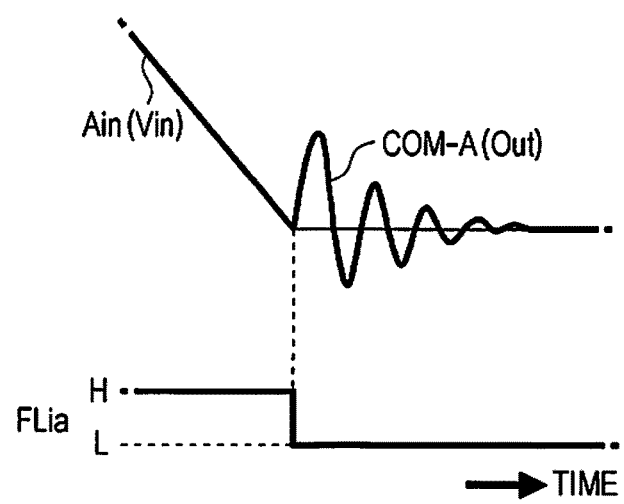
FIG. 25 is a diagram illustrating a problem of the drive circuit according to a comparative example.

Here, FIG. 25 is a diagram illustrating the operation of the drive circuit according to a comparative example.

If drive capability of the voltage output unit 202a increases, there is also a possibility the spike noise is overcome. However, an original purpose of the voltage output unit 202a is to supply a target voltage to a capacitive load such as the piezoelectric element Pzt, in a case where the voltage of the drive signal COM-A is constant (or in a case where a magnitude of voltage change per unit time is comparatively small, in detail in a case where the magnitude is less than or equal to a threshold which will be described below), even if both the transistors 231 and 232 are turned off. Accordingly, increasing the drive capability of the voltage output unit 202a not only deviates from the original purpose but also causes a circuit itself to be bulky and power consumption to deteriorate.

Hence, in a case where the magnitude of the voltage change of the original drive signal is less than or equal to a predetermined threshold, the signal Fba ranges between a voltage lower than the voltage (Vcm+V11) and a voltage higher than or equal to the voltage (Vcm−V12) even after the voltage of the drive signal COM-A changes from an increasing state or a decreasing state to a constant state, and when a current flowing through the node N11 is assumed to be sufficiently reduced, the switch 293 is turned on.

Figure 14:
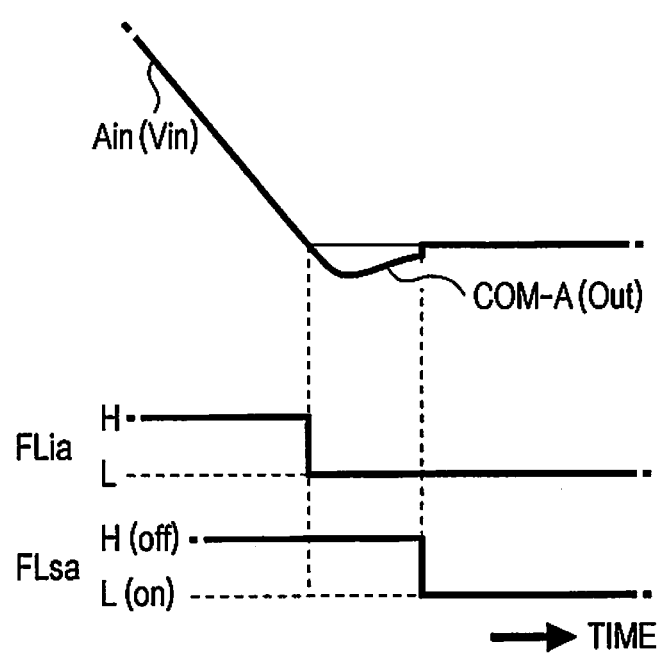
FIG. 14 is a diagram illustrating superiority of the drive circuit (first circuit).

Accordingly, it is possible to prevent spike noise from being superimposed on the drive signal COM-A as illustrated in FIG. 14 and to maintain good accuracy of liquid ejection, in the drive circuit 120a.

A current of the drive signal COM-A, that is, a current flowing through the node N11 changes depending on the number of piezoelectric elements Pzt to which the drive signal COM-A is applied, that is, print content defined by the print data SI. In detail, the current increases as the number of piezoelectric elements Pzt selected by the drive signal COM-A increases.

As the current flowing through the node N11 increases, the time when the current enters into a predetermined range based on the voltage Vcm is lengthened.

Here, the drive circuit 120a that outputs the drive signal COM-A is described, and a configuration of the drive circuit 120b that outputs the drive signal COM-B is the same as the configuration of the drive circuit 120a, and only input and output signals are different from each other. That is, the drive circuit 120b receives a signal OEb instead of the signal OEa, a signal OCb instead of the signal OCa, a signal Bin instead of the signal Ain, and a signal FLib instead of the signal FLia, and meanwhile, the drive signal COM-B is output from the node N2, and a signal Fbb having a voltage converted by a conversion unit 515b is fed back to the drive circuit 120b through the flexible flat cable 192.

In a case where the system is reset at the time of supplying power, returning from an error or the like, it is necessary to start or restart an operation after the drive signal COM-A (COM-B) is set to the voltage Vcen. In this case, if the signal Ain (Bin) is constant at the voltage Vcen, both the transistors 231 and 232 are turned off, and the amplification unit 200a (200b) does not operate. However, since the signal Xrst is at an L level as described above, the signal FLsa output from the output terminal /Q of the DFF 265 is set to an L level. Accordingly, in the drive circuits 120a and 120b, the switch 293 is forcibly turned on, and thereby, the drive signal COM-A (COM-B) is immediately set to the voltage Vcen by the linear amplifier 222.

The drive signal COM-A (COM-B) is not limited to the trapezoidal waveform, and may have a waveform having continuous inclination such as a sinusoidal wave. In a case where the drive circuit 120a outputs such a waveform, if a change of the voltage Vout (voltage Vin of the signal Ain) of the drive signal COM-A is relatively large, specifically, if a magnitude of a voltage change per unit time exceeds a predetermined threshold, the signal OEa may be set to an L level, and at this time, when the voltage decreases, the signal OCa may be set to an H level, and when the voltage increases, the signal OCa may be set to an L level.

In addition, if the change of the voltage Vout (voltage Vin of the signal Ain) of the drive signal COM-A is relatively small, specifically, if the magnitude of the voltage change per unit time is less than or equal to the threshold, the signal OEa may be set to an H level.

In a case where the signal FLsa is at an H level, the switch 293 is turned on and the output signal of the linear amplifier 222 becomes the drive signal COM-A, and thereby, the linear amplifier 222 requires slightly higher drive capability, compared with a case where the drive signal COM-A (signal Ain) has a trapezoidal waveform.

The drive signal COM-A (COM-B) swings at a voltage of approximately maximum 40 V and a current flowing therethrough is not small. Accordingly, in a configuration in which a resistance element or a Hall element is used as the conversion unit 515a (515b), the apparatus can be enlarged and complicated.

Hence, the printing apparatus (second apparatus) which avoids enlargement and complication will be described.

Figure 15:
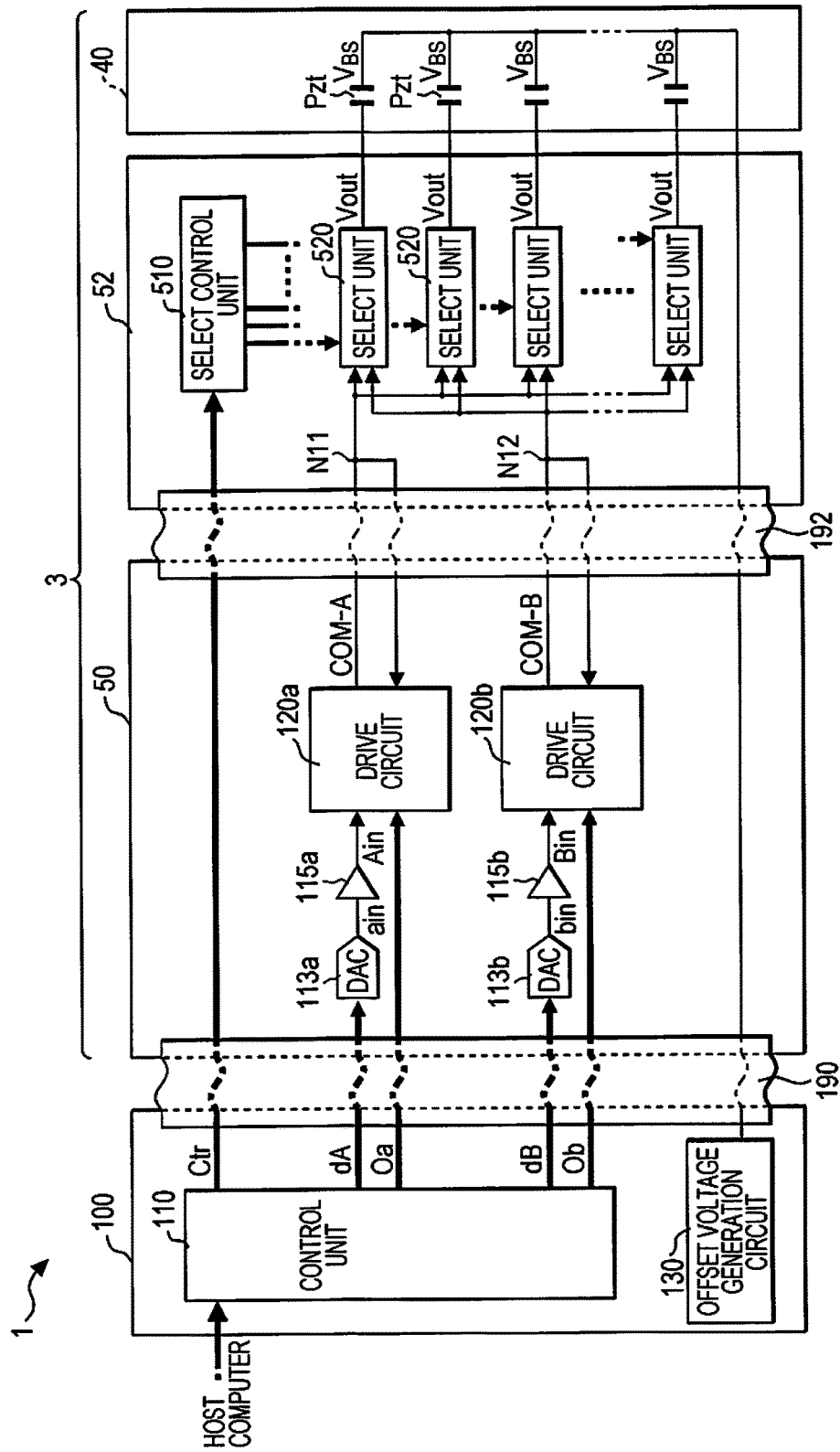
FIG. 15 is a diagram illustrating a schematic configuration of a printing apparatus (second apparatus).

FIG. 15 is a block diagram illustrating an electrical configuration of the printing apparatus (second apparatus).

The printing apparatus (second apparatus) illustrated in FIG. 15 is different from the printing apparatus (first apparatus) illustrated in FIG. 5 in that the conversion units 515a and 515b are not included, the drive signal COM-A of the node N11 is fed back to the drive circuit 120a through the flexible flat cable 192 and the drive signal COM-B of the node N12 is fed back to the drive circuit 120b through the flexible flat cable 192.

The drive circuits 120a and 120b applied to the printing apparatus (second apparatus) are different from the drive circuit (first apparatus) illustrated in FIG. 11. Hence, the drive circuits 120a and 120b applied to the printing apparatus (part 2) will be described as the drive circuit (second apparatus).

Figure 16:
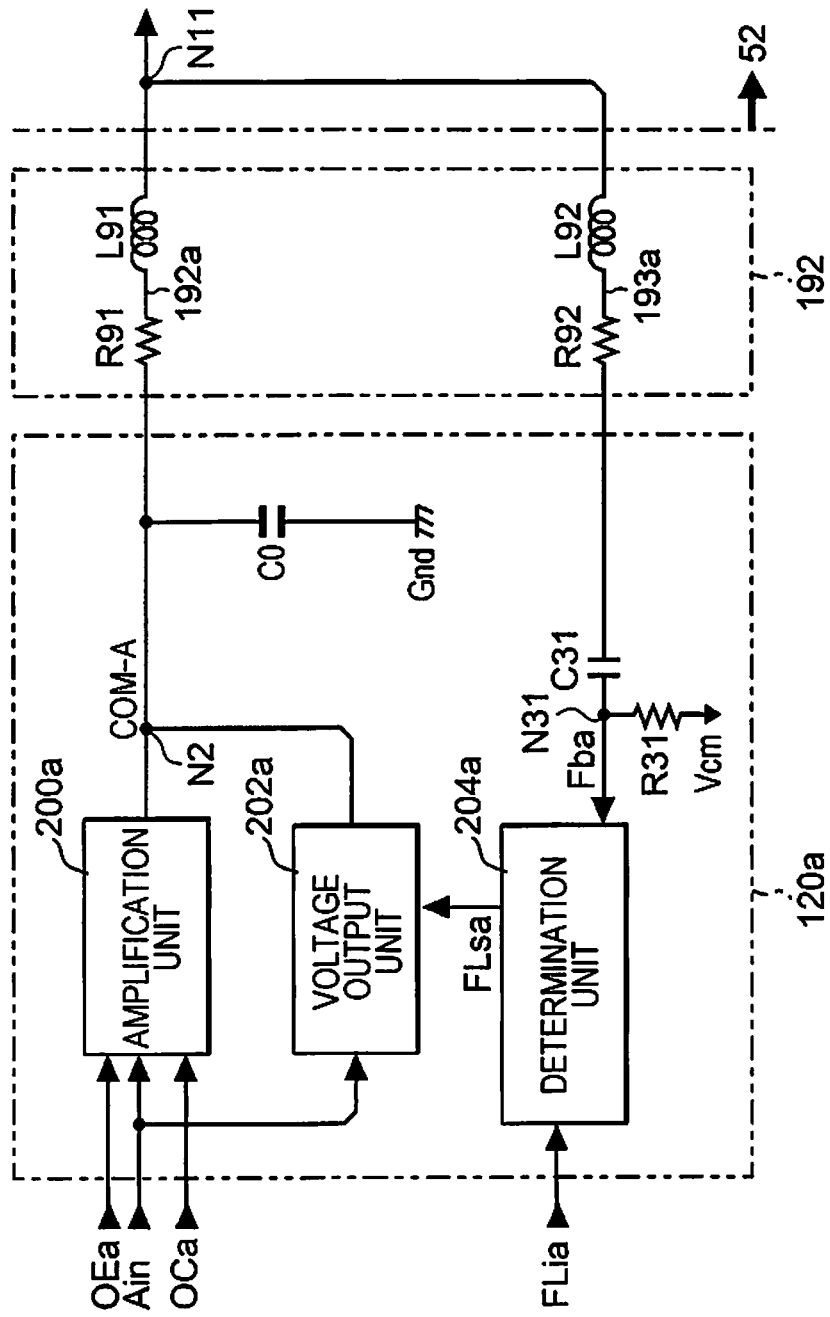
FIG. 16 is a diagram illustrating a configuration of a drive circuit (second circuit) applied to the printing apparatus (second apparatus).

FIG. 16 is a diagram illustrating the drive circuit (second apparatus) that outputs the drive signal COM-A and a peripheral unit thereof. The drive circuit (second apparatus) illustrated in FIG. 16 is different from the drive circuit (first apparatus) illustrated in FIG. 11 in that a capacitor C31 and a resistance element R31 are included the drive circuit (second apparatus).

This point will be described in detail as follows. The node N11 is coupled to one terminal of the capacitor C31 through the wire 193a (second wire) of the flexible flat cable 192. That is, one terminal of the capacitor C31 receives the drive signal COM-A from the node N11 through the wire 193a. The other terminal of the capacitor C31 is coupled to one terminal of the resistance element R31 and an input terminal of the determination unit 204a. The other terminal of the resistance element R31 is pulled down to the voltage Vcm.

Accordingly, the capacitor C31 and the resistance element R31 function as a differentiation circuit that differentiates the drive signal COM-A fed back from the node N11 through the wire 193a of the flexible flat cable 192.

A coupling node between the other terminal of the capacitor C31 and one terminal of the resistance element R31 is denoted as a node N31.

In a case where the voltage of the drive signal COM-A having a trapezoidal waveform is constant, a voltage of a signal obtained by differentiating the drive signal COM-A does not change, and thereby, a voltage of the node N31 becomes the voltage Vcm which is pulled down.

Meanwhile, in a case where the voltage of the drive signal COM-A increases, the voltage of the node N31 is higher than the voltage Vcm by an amount corresponding to a voltage increase rate of the drive signal COM-A.

In contrast to this, in a case where the voltage of the drive signal COM-A decreases, the voltage of the node N31 is lower than the voltage Vcm by an amount corresponding to the voltage decrease rate of the drive signal COM-A.

Accordingly, a signal appearing at the node N31 is approximately the same as the signal Fba of the drive circuit (first apparatus) illustrated in FIG. 11, and can be processed by the determination unit 204a illustrated in FIG. 12.

Here, an example of the drive circuit (second apparatus) is described on a side in which the drive signal COM-B is output, and in the same manner, a configuration in which the drive signal COM-B fed back from the node N12 through the flexible flat cable 192 is differentiated, is pulled down to the voltage Vcm, and is input to the determination unit 204b as the signal Fbb, is provided also on a side in which the drive signal COM-A is output.

The drive circuit (second apparatus) can maintain good accuracy of liquid ejection, and does not require the conversion unit 515a (515b) such as in the drive circuit (first apparatus), and thereby, it is possible to avoid enlargement of an apparatus in size and complication of the apparatus.

In addition, the drive circuit (second apparatus) can be replaced with the following application example.

Figure 17:
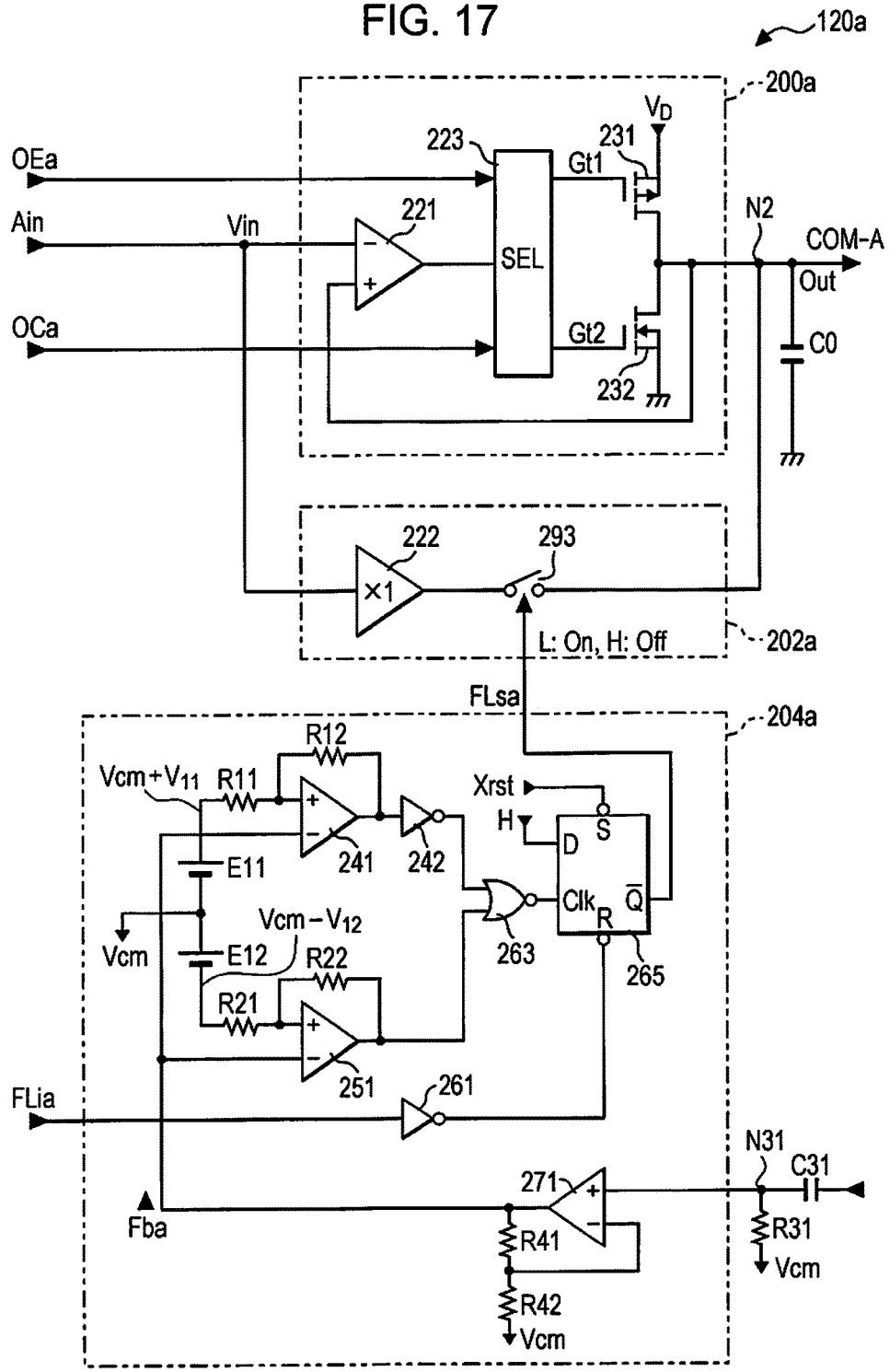
FIG. 17 is a diagram illustrating a first application example of the drive circuit (second circuit).

FIG. 17 is a diagram illustrating a configuration of a first application example of the drive circuit (second apparatus).

The first application example of the drive circuit (second apparatus) is different from the drive circuit (first apparatus) illustrated in FIG. 12 in that an operational amplifier 271 and resistance elements R41 and R42 are included, and an output of the operational amplifier 271 is supplied to both a negative input terminal (−) of the operational amplifier 241 and a negative input terminal (−) of the operational amplifier 251 as the signal Fba.

The difference will be described in detail as follows. The other terminal of the capacitor C31 and one terminal of the resistance element R31 are coupled to a positive input terminal (+) of the operational amplifier 271. An output terminal of the operational amplifier 271 is coupled to a supply point of the voltage Vcm serving as a reference of differentiation through the resistance elements R41 and R42 in order and a coupling point between the resistance elements R41 and R42 is fed back to the negative input terminal (−) of the operational amplifier 271.

Accordingly, the operational amplifier 271 performs non-inverting amplification of a differentiation signal of the drive signal COM-A and outputs the amplified signal as the signal Fba.

In a configuration (configuration of FIG. 12) in which the voltage is not amplified by the operational amplifier 271, a voltage range determined by the voltage V11 of the reference power supply E11 and the voltage V12 of the reference power supply E12 has to be set very narrowly, and there is a possibility that the voltage range is not influenced by noise, an offset voltage of the operational amplifiers 241 and 251 or the like. In contrast to this, since the voltage range is expanded in a configuration (configuration of FIG. 17) in which a voltage is amplified by the operational amplifier 271, influence of the noise, the offset voltage or the like can be reduced.

Figure 18:
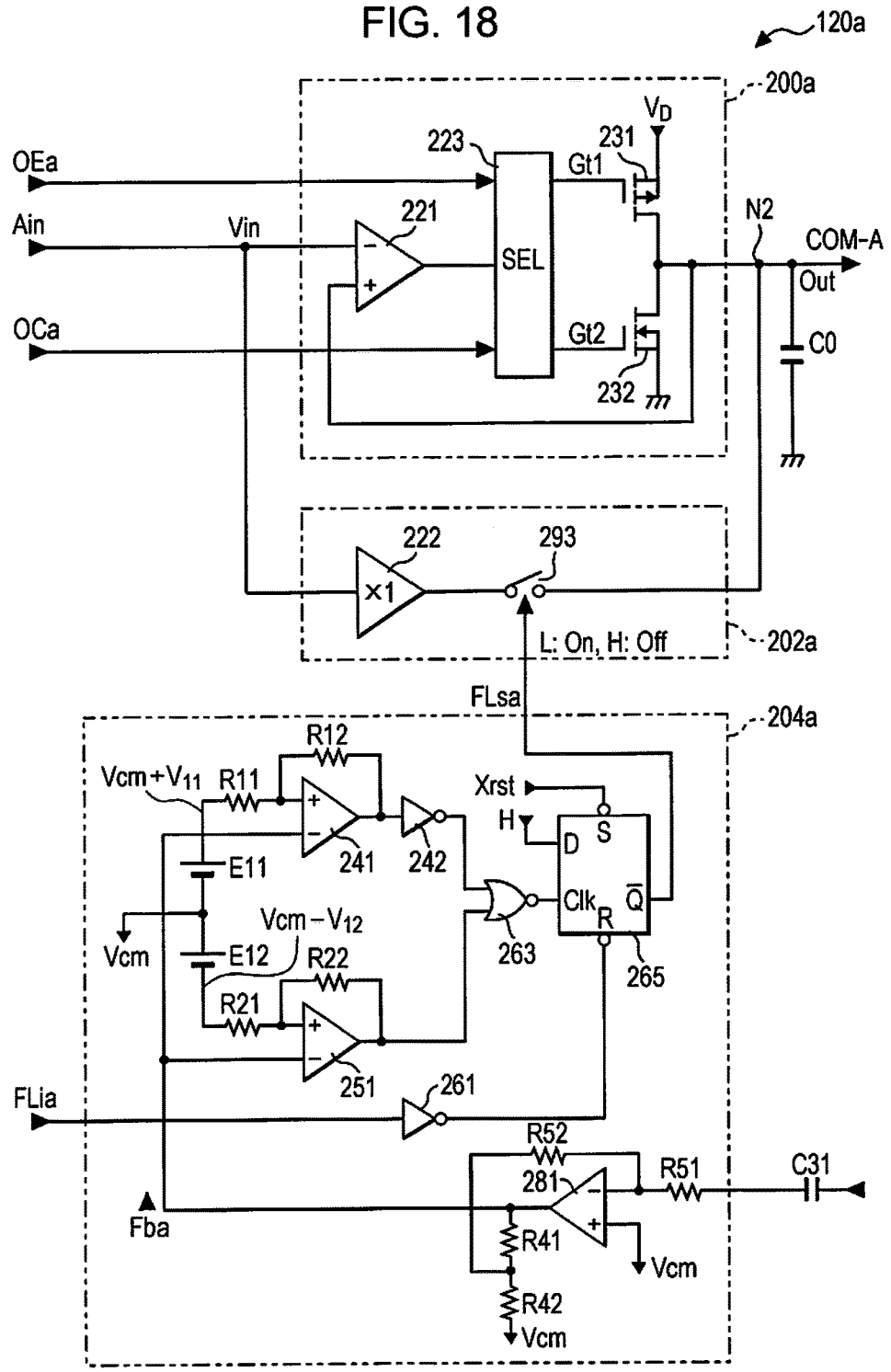
FIG. 18 is a diagram illustrating a second application example of the drive circuit (second circuit).

FIG. 18 is a diagram illustrating a configuration of a second application example of the drive circuit (second apparatus).

The second application example of the drive circuit (second circuit) is different from the drive circuit (first apparatus) illustrated in FIG. 12 in that the resistance element R31 is removed, an operational amplifier 281, resistance elements R41, R42, R51 and R52 are included, and an output of the operational amplifier 281 is supplied to both the negative input terminal (−) of the operational amplifier 241 and the negative input terminal (−) of the operational amplifier 251 as the signal Fba.

The difference will be described in detail as follows. The other terminal of the capacitor C31 is coupled to the negative input terminal (−) of the operational amplifier 281 through the resistance element R51. An output terminal of the operational amplifier 281 is coupled to a supply point of the voltage Vcm serving as a reference of differentiation through the resistance elements R41 and R42 in order, and a coupling point between the resistance elements R41 and R42 is coupled to the negative input terminal (−) of the operational amplifier 281 through the resistance element R52.

In addition, the voltage Vcm is applied to the positive input terminal (+) of the operational amplifier 281.

Accordingly, the operational amplifier 281 performs inverting amplification of the differentiation signal of the drive signal COM-A and outputs the amplified signal as the signal Fba.

Hence, influence of noise, an offset voltage or the like can also be reduced in the second application example, in the same manner as in the first application example.

The second application example is different from the drive circuits illustrated in FIG. 12 and FIG. 17 in that the differentiation signal of the drive signal COM-A is inverted and supplied to the negative input terminal (−) of the operational amplifier 241 and the negative input terminal (−) of the operational amplifier 251. However, the second application example is the same as the drive circuits illustrated in FIG. 12 and FIG. 17 in that, when a voltage ranges between a voltage lower than the voltage (Vcm+V11) and a voltage higher than or equal to the voltage (Vcm−V12) after the voltage of the drive signal COM-A changes from an increasing state or a decreasing state to a constant state, a negative logical sum signal of the NOR circuit 263 changes to an H level.

Figure 19:
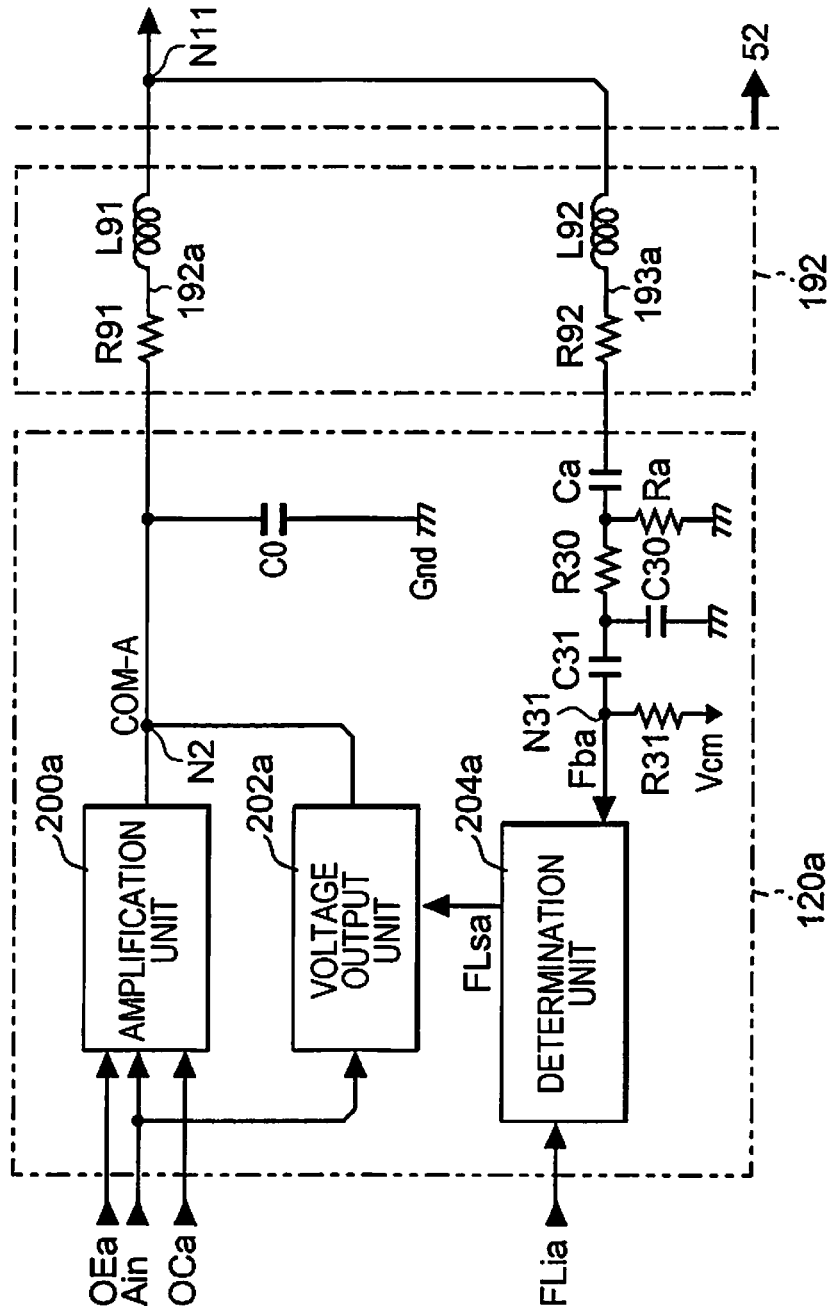
FIG. 19 is a diagram illustrating a third application example of the drive circuit (second circuit).

FIG. 19 is a diagram illustrating a configuration of a third application example of the drive circuit (second apparatus).

The third application example of the drive circuit (second apparatus) is different from the drive circuit illustrated in FIG. 16 in that capacitors Ca and C30 and resistance elements Ra and R30 are added.

In detail, one terminal of the capacitor Ca is coupled to the wire 193a of the flexible flat cable 192 and receives the drive signal COM-A fed back from the node N11. The other terminal of the capacitor Ca is coupled to both one terminal of the resistance element Ra and one terminal of the resistance element R30. The other terminal of the resistance element Ra is coupled to the ground Gnd, and the other terminal of the resistance element R30 is coupled to both one terminal of the capacitor C30 and one terminal of the capacitor C31. The other terminal of the capacitor C30 is coupled to the ground Gnd.

In the configuration, the drive signal COM-A fed back through the wire 193a is differentiated by a differentiation circuit configured with the capacitor Ca and the resistance element Ra by using the ground Gnd as a reference. After passing through a low pass filter configured with the resistance element R30 and the capacitor C30, the differentiated signal is differentiated by a differentiation circuit configured with the capacitor C31 and the resistance element R31 by using the voltage Vcm as a reference, and is supplied to the determination unit 204a as the signal Fba.

Noise components are superimposed on the drive signal COM-A when the drive signal COM-A is fed back through the wire 193a of the flexible flat cable 192, and thereby, accuracy of voltage determination of the determination unit 204a can decrease. In contrast to this, according to the third application example, the noise components are removed by the low pass filter configured with the resistance element R30 and the capacitor C30, and thus, it is possible to prevent the determination accuracy of the determination unit 204a from decreasing.

Figure 20:
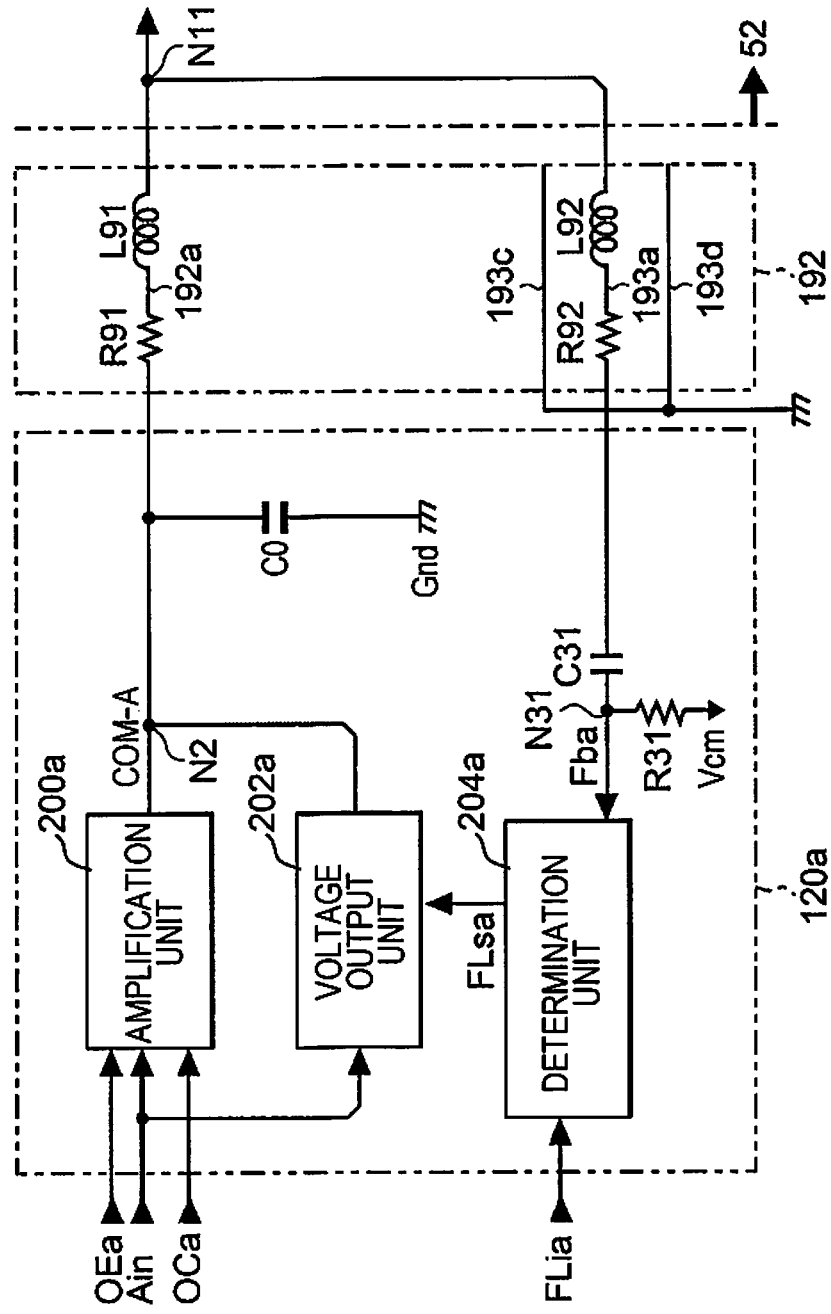
FIG. 20 is a diagram illustrating a fourth application example of the drive circuit (second circuit).

FIG. 20 is a diagram illustrating a configuration of a fourth application example of the drive circuit (second apparatus).

As illustrated in the figure, the fourth application example of the drive circuit (second apparatus) has a configuration in which, among a plurality of wires of the flexible flat cable 192, the wire 193c (third wire) and the wire 193d (fourth wire) adjacent to both sides of the wire 193a which is a feedback path of the drive signal COM-A are coupled to, for example, the ground Gnd, and shield the wire 193a which is the feedback path.

According to the application example, the noise components are hardly superimposed on the drive signal COM-A when the drive signal COM-A is fed back through the wire 193a, and thus, it is possible to prevent the determination accuracy of the determination unit 204a from decreasing.

Since the shield may be a constant potential, the shield is not limited to the ground Gnd, and may be, for example, the voltage Vcm.

In addition, while not illustrated in particular, in a case where a plurality of flexible flat cables 192 overlap each other, for example in a case where three cables overlap each other and the wire 193a is provided in the intermediate flexible flat cable 192 as a feedback path, a wire located on an upper position with respect to the feedback path and a wire located on an lower position with respect to the feedback may be used as shield wires in addition to the wire 193c and the wire 193d on both sides of the intermediate wire 193a. Thereby, it possible to further enhance a function of the shield.

In addition, Removal of noise by a low pass filter and shield by the flexible flat cable 192 may be performed together.

Figure 21:
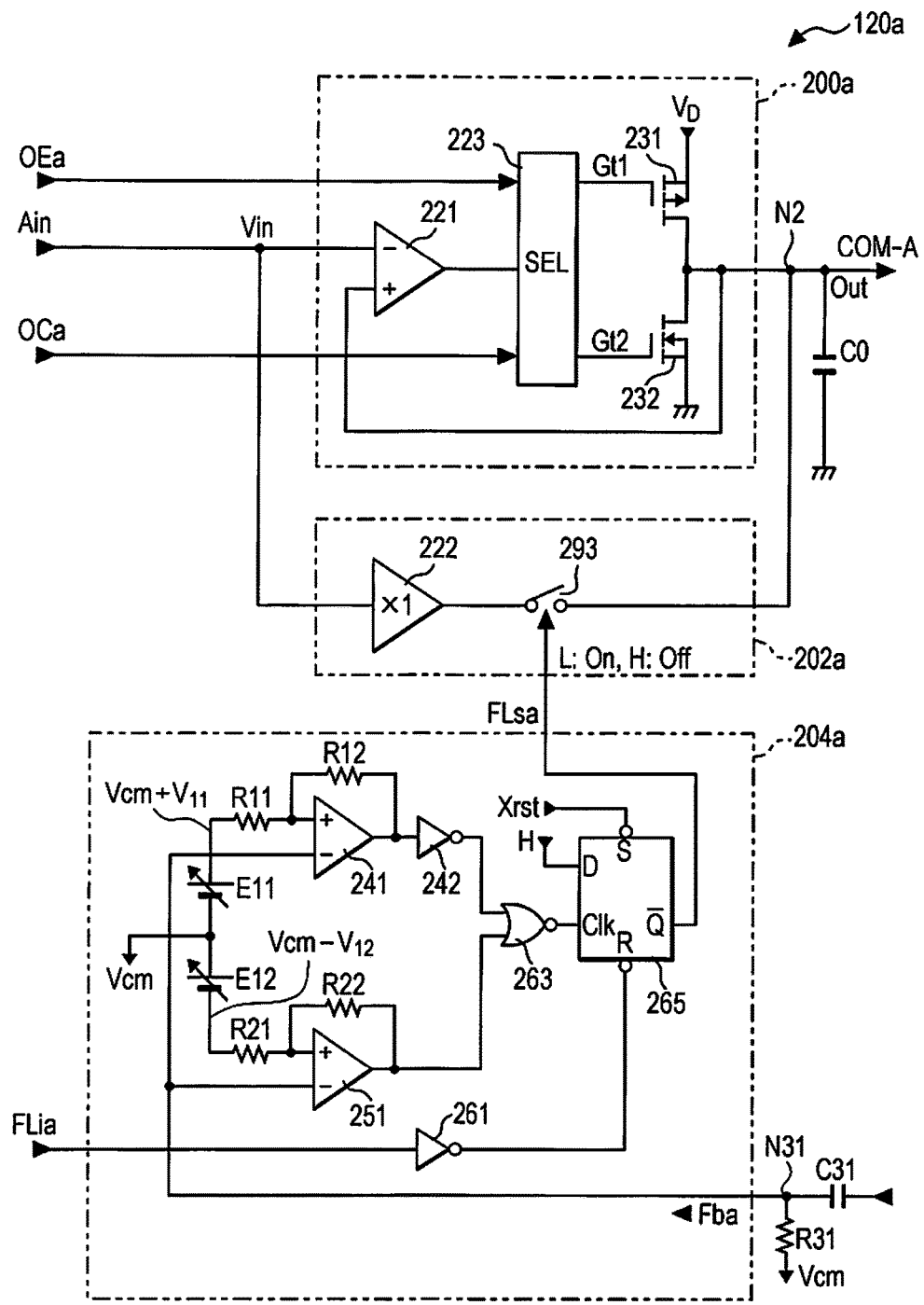
FIG. 21 is a diagram illustrating a detailed configuration of a fifth application example of the drive circuit (second circuit).

FIG. 21 is a diagram illustrating a configuration of a fifth application example of the drive circuit (second apparatus).

The fifth application example of the drive circuit (second apparatus) has a configuration in which the voltage V11 of the reference power supply E11 and the voltage V12 of the reference power supply E12 are variably set.

Here, a reason why the voltages V11 and V12 are variable will be described.

Characteristics of the piezoelectric element Pzt, in detail, bending characteristics with respect to a voltage change of the piezoelectric element Pzt are relatively the same as each other in a plurality of piezoelectric elements Pzt in the same one actuator substrate 40, but are not the same in the piezoelectric elements Pzt in other actuator substrates 40 due to manufacture variation and the like. Accordingly, for example, the piezoelectric element Pzt in a certain actuator substrate 40 is bent by a smaller voltage amplitude by the same amount than the piezoelectric element Pzt in another actuator substrate 40, in other words, the same amount of liquid can be ejected by a smaller voltage amplitude.

In contrast to this, the piezoelectric element Pzt in a certain actuator substrate 40 may require a larger voltage amplitude to eject the same amount of liquid than the piezoelectric element Pzt in another actuator substrate 40.

Here, a term "voltage amplitude" indicates a voltage range from a voltage maximum value to a voltage minimum value of the drive signal, and indicates the maximum voltage Vmax to the minimum voltage Vmin in a case of the drive signal COM-A.

In order to cope with a case where characteristics of the piezoelectric element Pzt differ for each actuator substrate 40 (head unit 3), measures are taken in which the characteristics of the piezoelectric element Pzt are measured in advance and a voltage amplitude of the drive signal is set according to the measured characteristics.

In a case where the piezoelectric element Pzt in a certain actuator substrate 40 is bent by a smaller voltage amplitude by the same amount than the piezoelectric element Pzt in another actuator substrate 40, there is a case where sensitivity of the piezoelectric element Pzt in a certain actuator substrate 40 is termed to be high.

Figure 22:
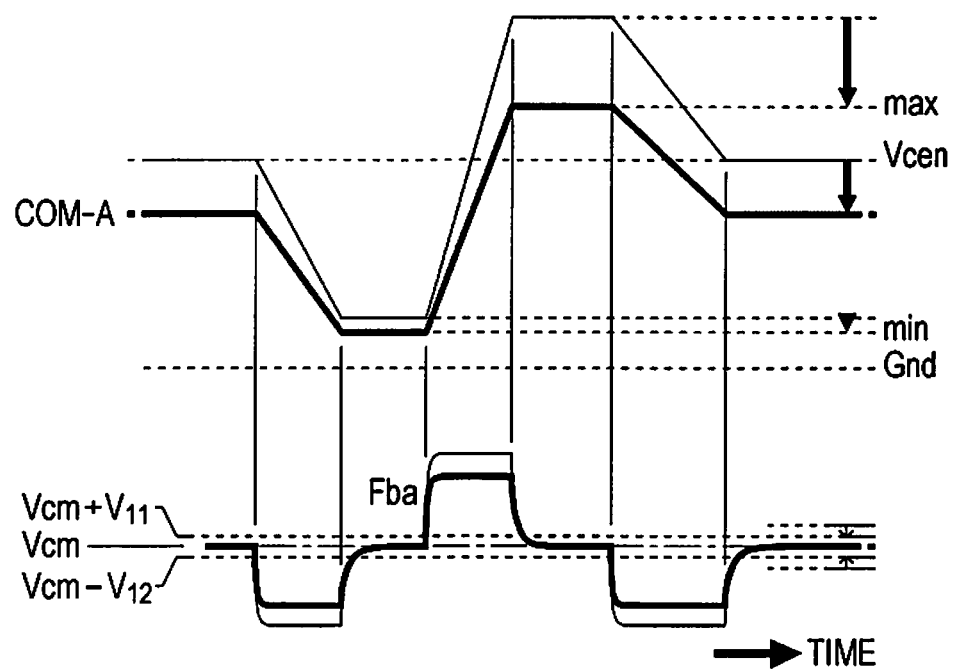
FIG. 22 is a diagram illustrating an operation of the fifth application example.

FIG. 22 is a diagram illustrating an example in which the voltage amplitude of the drive signal is set according to the characteristics of the piezoelectric element Pzt.

FIG. 22 illustrates an example in which a thin line of the drive signal COM-A is set to have a large voltage amplitude because sensitivity of the piezoelectric element Pzt is relatively low, and an example in which a thick line of the drive signal COM-A is set to have a small voltage amplitude because the sensitivity of the piezoelectric element Pzt is relatively high.

For setting the voltage amplitude, for example, the voltage amplitude is set by using the ground Gnd of zero volts (fixed) as illustrated in FIG. 22. A reason why the ground Gnd is used as a reference is that, for example, if the sensitivity of the piezoelectric element Pzt is high, the intermediate voltage Vcen and the maximum voltage Vmax can be suppressed low as illustrated in FIG. 22. Furthermore, since a high side voltage at the time of generating the drive signal, that is, (specifically, the voltage $V_D$) can be suppressed low, it is possible to burden a power supply circuit (not shown) generating the voltage $V_D$.

For setting the voltage amplitude, the ground Gnd may not be used as a reference, the voltage Vmin may be used as the reference.

Hence, if the voltage amplitude of the drive signal COM-A is set to be small so as to increase the sensitivity of the piezoelectric element Pzt as illustrated in FIG. 22, the voltage amplitude of the signal Fba obtained by feeding back and differentiating the drive signal COM-A is also decreased more than the voltage Vcm.

Accordingly, regarding whether or not a current of the drive signal COM-A is less than or equal to a threshold, in a case where whether or not the differentiated drive signal is determined to be within a range between a voltage lower than the voltage (Vcm+V11) obtained by shifting the voltage Vcm which is a reference of the differentiated signal toward a high side direction by the voltage V11 and a voltage higher than or equal to the voltage (Vcm−V12) obtained by shifting the voltage Vcm toward a low side direction by the voltage V12, the voltage range is also required to be adjusted according to the sensitivity.

Hence, in the drive circuit 120a according to the fifth application example, if the maximum voltage Vmax of the drive signal COM-A is low, the voltage V11 of the reference power supply E11 and the voltage V12 of the reference power supply E12 are set to be low, and in contrast to this, in a case where the voltage Vmax is high, the voltages V11 and V12 are set to be high.

The same effect can also be achieved by a configuration in which an object of relative comparison is reversed. That is, the voltage V11 of the reference power supply E11 and the voltage V12 of the reference power supply E12 are fixed, and thereafter, a voltage amplitude of a signal input to the negative input terminal (−) of the operational amplifier 241 and the negative input terminal (−) of the operational amplifier 251 is changed.

In detail, in a case where the sensitivity of the piezoelectric element Pzt is high as described above, the voltage amplitude of the drive signal COM-A is set to be small, and thereby, the voltage amplitude of the signal Fba obtained by feeding back and differentiating the drive signal COM-A also decreases more than the voltage Vcm, and meanwhile, in a case where the sensitivity is low, the voltage amplitude of the drive signal COM-A is set to be large, and thereby, the voltage amplitude of the signal Fba also increases. Accordingly, for example, if the sensitivity of the piezoelectric element Pzt is high, a gain of the operational amplifier 281 may be increased, and meanwhile, if the sensitivity is low, the gain may be decreased.

Since the gain of the operational amplifier 281 is defined by voltage division ratio between the resistance elements R41 and R42, in order to make the gain of the operational amplifier 281 variable, at least one of the resistance elements R41 and R42 can be used as a variable resistor and a resistance value thereof can be set to a resistance value depending on the sensitivity.

In addition, as described above, the control unit 110 outputs the data dA (and dB) that defines the waveform of the drive signal COM-A (and COM-B). Accordingly, a configuration may be provided in which the sensitivity of the piezoelectric element Pzt is classified into plural pieces, and data dA (and dB) is prepared in advance for each of the plurality of classifications, while data dA (and dB) corresponding to the sensitivity of the piezoelectric element Pzt which is applied is output from the control unit 110, data indicating the sensitivity of the piezoelectric element Pzt which is applied is supplied to the drive circuit 120a, and the drive circuit 120a sets the voltages V11 and V12 (or the gain of the operational amplifier 281) according to the data.

In addition, the control unit 110 does not output the data dA (and dB) corresponding to the classification, but may generate the voltage $V_D$ depending on the sensitivity of the piezoelectric element Pzt which is applied and may use voltages proportional to the voltage $V_D$ as the voltages V11 and V12.

In the five application examples, the drive circuit 120a that outputs the drive signal COM-A is described, but the drive circuit 120b that outputs the drive signal COM-B has the same configuration as the drive circuit 120a except for the input and output signals, as described above.

As described above, although the drive signal COM-A changes from a voltage change to a constant voltage, the current of the drive signal does not immediately decrease to zero due to the inductance component L91. In detail, as a current flowing while the voltage of the drive signal COM-A is changing increases, the voltage of the drive signal COM-A becomes constant, and thereby, the time taken until the current becomes zero is lengthened.

Here, the current flowing while the voltage of the drive signal COM-A is changing changes depending on the number of piezoelectric elements Pzt to which the drive signal COM-A is applied, that is, the print contents defined by the print data SI. Accordingly, the current flowing while the voltage of the drive signal COM-A is changing can be estimated by analyzing the print data SI.

Hence, next, a drive circuit (third circuit) which analyzes the print data SI and determines a timing when the switch 293 is turned on according to the analysis result will be described.

Figure 23:
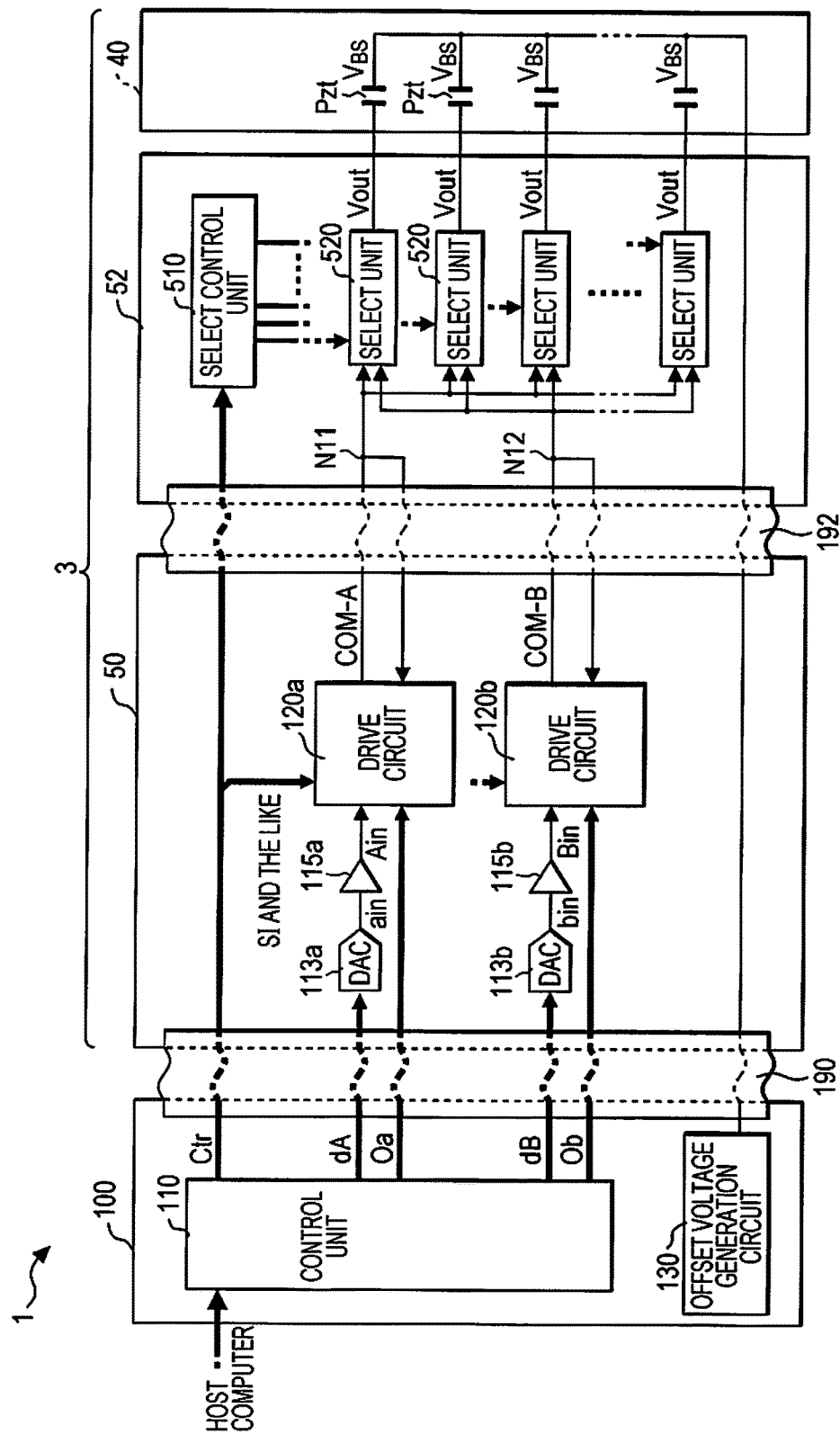
FIG. 23 is a block diagram illustrating an electrical configuration of the printing apparatus (third apparatus).

FIG. 23 is a block diagram illustrating an electrical configuration of a printing apparatus (third apparatus) to which the drive circuit (third circuit) is applied.

The printing apparatus (third apparatus) illustrated in FIG. 23 is different from the printing apparatus (first apparatus) illustrated in FIG. 5 in that the print data SI and the like which are a part of the control signal Ctr are respectively supplied to the drive circuits 120a and 120b.

Figure 24:
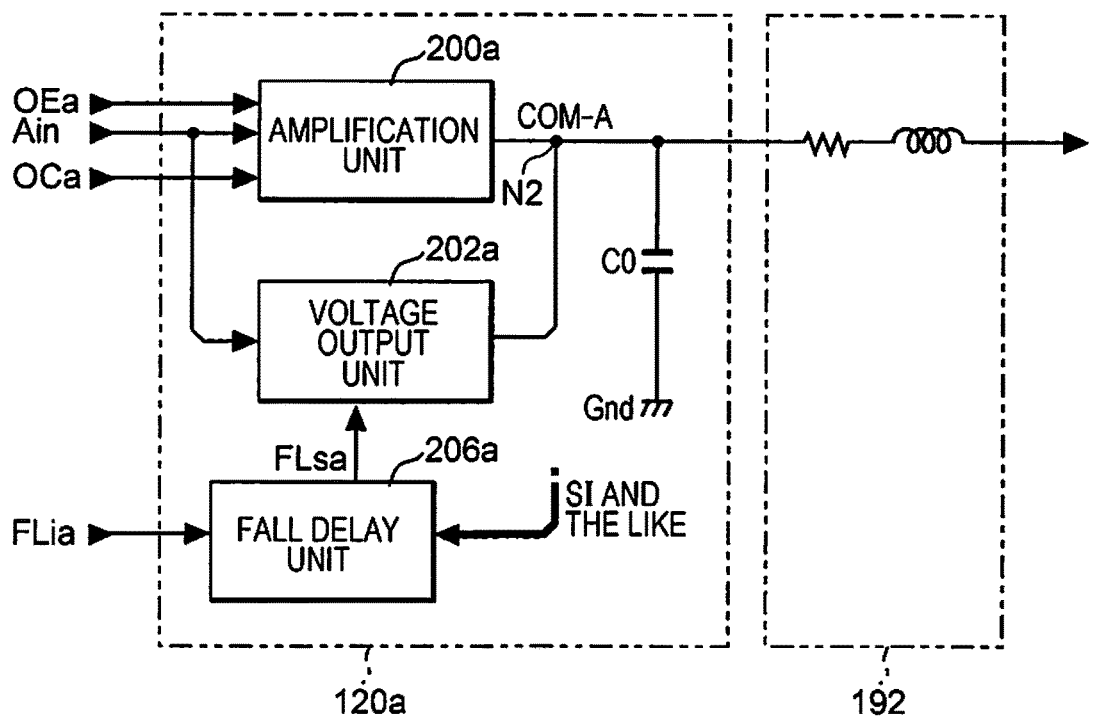
FIG. 24 is a diagram illustrating a configuration of the drive circuit (second circuit) applied to the printing apparatus (third apparatus).

FIG. 24 is a diagram illustrating a configuration of the drive circuit (third circuit). The drive circuit (third circuit) illustrated in FIG. 24 is mainly different from the drive circuit (first circuit) illustrated in FIG. 11 in that the determination unit 204a is replaced with a fall delay unit 206a and the print data SI and the like are supplied to the fall delay unit 206a.

This point will be described in detail. The fall delay unit 206a in the drive circuit (third circuit) estimates a magnitude of the current from the print data SI, delays a fall of the signal FLia according to the magnitude of the estimated current, and outputs the delayed signal as a signal FLsa.

Specifically, the description is as follows.

That is, firstly, the fall delay unit 206a latches the print data SI included in the control signal Ctr from the control unit 110 by using the same circuit as the shift register 512 and the latch circuit 514 in the select control unit 510 (see FIG. 8), analyzes the latched print data SI, and calculates the number of piezoelectric elements Pzt having one terminal to which the drive signal COM-A is applied during each of the periods T1 and T2 of the print cycle Ta. Secondly, the fall delay unit 206a lengthens the amount of delay of the fall of the signal FLia as the calculated number of piezoelectric elements Pzt increases, and outputs the delayed signal as the signal FLsa (see FIG. 13).

Since the signal FLia goes to an H level during a voltage change period of the drive signal COM-A and goes to an L level during a constant voltage period, a fall from an H level to an L level is delayed depending on the obtained number (estimated magnitude of the current), and thereby, the same effect as the effect of the drive circuits (first circuit, and the second circuit) can be expected by delaying according to the size (size) of the drive circuit.

The fall delay unit 206a does not change a rise of the signal FLia regardless of the number.

Since a drive target of the drive circuits (first circuit, second circuit, and third circuit) is a capacitive load such as the piezoelectric element Pzt, although the node N2 enters a high impedance state after the voltage Out becomes constant, the voltage Out is maintained constant. Accordingly, ON of the switch 293 may not continue until the transistor 231 or 232 performs a next switching operation. For example, the voltage of the drive signal COM-A changes from an increasing state or a decreasing state to a constant state, and thereafter, when a voltage obtained by converting the current of the drive signal COM-A enters into a predetermined range (or when a voltage of a signal obtained by differentiating the drive signal COM-A enters into a predetermined range), the switch 293 is turned on, and thereafter, ON of the switch 293 may be canceled before the transistor 231 or 232 performs a next switching operation.

A function required as the amplification unit 202 in each of the drive circuits (first circuit, second circuit, and third circuit) is that the signal Ain is converted into low impedance and output to the node N2 in a case where the voltage of the signal Ain changes (or in a case where the voltage change is relatively large), while an output terminal thereof is decoupled from the node N2 in a case where the voltage of the signal Ain is constant (or in a case where the voltage change is relatively small).

Accordingly, If the same function is provided, the amplification unit 202 may be configured to include an AB-class amplifier and a switch.

The drive circuits (first circuit, second circuit, and third circuit) have a voltage amplification factor of one time for the linear amplifier 222 in the voltage output unit 202*a*, and this is because the voltage amplification factor of the amplification unit 200*a* is one time. If the voltage amplification factor of the amplification unit 200*a* is set to 10 times, the voltage amplification factor of the linear amplifier 222 may also be set to 10 times.

In order to make the voltage multiplication factor of the amplification unit 200*a* be a times, the power supply voltage $V_D$ may be set to be a voltage higher than or equal to the amplified maximum voltage, the voltage Out of the node N2 may decrease by (1/a) times, and the voltage may be fed back to the positive input terminal (+) of the differential amplifier 221.

In addition, in a case where the drive circuits (first circuit, second circuit, and third circuit) output a trapezoidal waveform illustrated in FIG. 6 or FIG. 13 as a drive signal, a voltage to be output by the linear amplifier 222 is determined in advance for each period. In detail, referring to FIG. 13, the voltage to be output by the linear amplifier 222 is the voltage Vmin during the period P2 among the voltage constant periods, is the voltage Vmax during the period P4, and is the voltage Vcen during the period P6.

Accordingly, the linear amplifier 222 may be replaced with a constant voltage source which outputs the voltage Vmin during the period P2, outputs the voltage Vmax during the period P4, and outputs the voltage Vcen during the period P6.

Each of the drive circuit (first circuit, second circuit, and third circuit) may include a diode for blocking a current flowing from the node N2 to a drain terminal of the transistor 231 and a diode for blocking a current flowing from a drain terminal of the transistor 232 to the node N2.

Each of the printing apparatuses (first apparatus, second apparatus, and third apparatus) has a configuration (multicomb) in which the print cycle Ta is divided into two periods T1 and T2, and one of two types of drive signals COM-A and COM-B is selected (or not selected) so as to be applied to one terminal of the piezoelectric element Pzt, the number of divisions of the print cycle Ta is not limited to "2", and the number of drive signals is also not limited to "2".

In addition, a configuration (single comb) may be provided in which one or more trapezoidal waveforms are extracted from one type of drive signal that repeats a plurality of mutually different trapezoidal waveforms in a predetermined order in accordance with the printing data SI, and are applied to one terminal of the piezoelectric element Pzt.

In the single comb configuration, a current detection point of the drive signal may be a common coupling point between the other terminals of the plurality of piezoelectric elements Pzt, not the node N11 which is in front of the select unit 520 as viewed from the drive circuit 120*a*.

A configuration may be provided in which, during a period in which the linear amplifier 222 does not supply an output signal to the node N2, the power supply is decoupled from the linear amplifier 222, the operation of the linear amplifier 222 stops, and thereby power consumption is reduced.

Each of the drive circuits 120*a* and 120*b* is configured to be mounted on the head unit 3, but may be configured to be mounted on the main substrate 100.

However, the configuration in which the drive circuits 120*a* and 120*b* are mounted on the main substrate 100 does not require to supply a signal with a large amplitude to the head unit 3 through the long flexible flat cable 190, and thus, it is disadvantageous in terms of power consumption and noise resistance. In other words, it is not necessary to supply a signal with a large amplitude to the flexible flat cable 190, in the configuration in which the drive circuits 120*a* and 120*b* are mounted on the head unit 3, and thus, it is advantageous in terms of power consumption and noise resistance.

A liquid ejecting apparatus is described as a printing apparatus in the above description, but may be a three-dimensional shaping apparatus which ejects a liquid to form a three-dimensional object, a textile printing apparatus which ejects a liquid to dye a fabric, or the like.

Furthermore, in the above description, an example is described in which the piezoelectric element Pzt for ejecting ink is used as a drive target of the drive circuits 120*a* and 120*b*, but when considering separating the drive circuits 120*a* and 120*b* from the printing apparatus, the drive target is not limited to the piezoelectric element Pzt, and can be applied to all of loads with capacitive components, such as an ultrasonic motor, a touch panel, an electrostatic speaker, and a liquid crystal panel.

The entire disclosure of Japanese Patent Application No. 2016-187565, filed Sep. 26, 2016 is expressly incorporated by reference herein.

What is claimed is:
1. A liquid ejecting apparatus comprising:
   an ejecting unit that includes a piezoelectric element which is driven based on a drive signal that is output from a predetermined output terminal, and ejects liquid by driving the piezoelectric element;
   an amplification unit that amplifies an original drive signal which is an origin of the drive signal and outputs the amplified signal toward the output terminal;
   a first wire that transmits the drive signal from the output terminal toward the piezoelectric element;
   a second wire that feeds back the drive signal which is transmitted by the first wire;
   a differentiation circuit that differentiates the drive signal which is fed back by the second wire;
   a determination unit that determines whether or not a voltage of the drive signal which is differentiated by the differentiation circuit is within a predetermined range, in a case where a magnitude of a voltage change of the original drive signal is less than or equal to a predetermined threshold; and a voltage output unit that outputs a voltage according to the original drive signal toward the output terminal, in a case where it is determined that the voltage of the drive signal which is differentiated by the differentiation circuit is within the predetermined range.

2. The liquid ejecting apparatus according to claim 1, further comprising:

a third wire and a fourth wire which are adjacent to the second wire and to which a predetermined voltage is applied.

3. The liquid ejecting apparatus according to claim 1, further comprising:

a first substrate on which the amplification unit, the determination unit, and the voltage output unit are mounted; and a second substrate that is coupled to the first substrate through the first wire and the second wire.

4. The liquid ejecting apparatus according to claim 1, wherein the amplification unit includes a differential amplifier that outputs a control signal on the basis of a signal based on the original drive signal and the drive signal, a high side transistor that is coupled between a high side of a power supply and the output terminal, a low side transistor that is coupled between the output terminal and a low side of the power supply, and a select unit that selects the high side transistor or the low side transistor depending on the voltage change of the original drive signal, and supplies the control signal toward a gate terminal of the selected transistor.

5. The liquid ejecting apparatus according to claim 4, wherein the select unit supplies the control signal toward a gate terminal of the high side transistor in a first case where the voltage change of the original drive signal is in an increasing direction and the magnitude of the voltage change exceeds the threshold, and supplies the control signal toward a gate terminal of the low side transistor in a second case where the voltage change of the original drive signal is in a decreasing direction and the magnitude of the voltage change exceeds the threshold.

6. The liquid ejecting apparatus according to claim 5, wherein, in a case where the magnitude of the voltage change of the original drive signal is less than or equal to the threshold, the select unit supplies a signal that turns off the high side transistor toward the gate terminal of the high side transistor, and supplies a signal that turns off the low side transistor toward the gate terminal of the low side transistor, wherein, in the first case, the select unit supplies a signal that turns off the low side transistor toward the gate terminal of the low side transistor, and wherein, in the second case, the select unit supplies a signal that turns off the high side transistor toward the gate terminal of the high side transistor.

7. The liquid ejecting apparatus according to claim 1, wherein the voltage output unit includes a linear amplifier that amplifies a voltage of the original drive signal by a predetermined multiple, and a switch that is provided between the linear amplifier and the output terminal, and is turned on in a case where it is determined that a voltage of a drive signal which is differentiated by the differentiation circuit is within a predetermined range.

8. The liquid ejecting apparatus according to claim 1, wherein the ejecting unit, the amplification unit, the determination unit, and the voltage output unit are mounted on a movable carriage.

9. A drive circuit which drives a capacitive load in accordance with a drive signal that is output from a predetermined output terminal, the circuit comprising:

an amplification unit that amplifies an original drive signal which is an origin of the drive signal and outputs the amplified signal toward the output terminal;

a first wire that transmits the drive signal from the output terminal toward the piezoelectric element;

a second wire that feeds back the drive signal which is transmitted by the first wire;

a differentiation circuit that differentiates the drive signal which is fed back by the second wire;

a determination unit that determines whether or not a voltage of the drive signal which is differentiated by the differentiation circuit is within a predetermined range, in a case where a magnitude of a voltage change of the original drive signal is less than or equal to a predetermined threshold; and a voltage output unit that outputs a voltage according to the original drive signal toward the output terminal in a case where it is determined that the voltage of the drive signal which is differentiated by the differentiation circuit is within the predetermined range.

10. A driving method which drives a capacitive load in accordance with a drive signal that is output from a predetermined output terminal, the method comprising:

Causing an amplification unit to amplify an original drive signal which is an origin of the drive signal and outputting the amplified signal toward the output terminal;

transmitting the drive signal from the output terminal toward the piezoelectric element through a first wire;

feeding back the drive signal which is transmitted by the first wire through a second wire;

differentiating the drive signal which is fed back by the second wire;

determining whether or not a voltage of the differentiated drive signal is within a predetermined range, in a case where a magnitude of a voltage change of the original drive signal is less than or equal to a predetermined threshold; and causing a voltage output unit to output a voltage according to the original drive signal toward the output terminal in a case where it is determined that the voltage of the differentiated drive signal is within the predetermined range.

* * * * *